(12) United States Patent
Noda et al.

(10) Patent No.: US 7,518,917 B2
(45) Date of Patent: Apr. 14, 2009

(54) NONVOLATILE MEMORY UTILIZING MIS MEMORY TRANSISTORS CAPABLE OF MULTIPLE STORE OPERATIONS

(75) Inventors: Kenji Noda, Fukuoka (JP); Takashi Kikuchi, Fukuoka (JP)

(73) Assignee: NScore Inc., Fukuoka (JP)

( * ) Notice: Subject to any disclaimer, the term of this patent is extended or adjusted under 35 U.S.C. 154(b) by 148 days.

(21) Appl. No.: 11/775,951

(22) Filed: Jul. 11, 2007

(65) Prior Publication Data

US 2009/0016105 A1    Jan. 15, 2009

(51) Int. Cl.
*G11C 11/34* (2006.01)
(52) U.S. Cl. .................... 365/185.08; 365/154
(58) Field of Classification Search ............ 365/185.08, 365/154, 185.23, 185.05
See application file for complete search history.

(56) References Cited

U.S. PATENT DOCUMENTS

| | | | |
|---|---|---|---|
| 3,636,530 A | 1/1972 | Mark et al. | |
| 4,419,744 A | 12/1983 | Rutter | |
| 5,488,579 A * | 1/1996 | Sharma et al. | 365/185.08 |
| 5,956,269 A | 9/1999 | Quyang et al. | |
| 6,038,168 A | 3/2000 | Allen et al. | |
| 6,064,590 A | 5/2000 | Han et al. | |
| 6,104,635 A * | 8/2000 | Ogane | 365/185.08 |
| 6,469,930 B1 * | 10/2002 | Murray | 365/185.08 |
| 6,740,927 B1 | 5/2004 | Jeng | |
| 6,906,953 B2 | 6/2005 | Forbes | |
| 6,906,962 B2 | 6/2005 | Layman et al. | |
| 6,909,635 B2 | 6/2005 | Forbes et al. | |
| 7,164,608 B2 * | 1/2007 | Lee | 365/189.05 |
| 7,227,234 B2 | 6/2007 | Roizin et al. | |
| 2004/0232477 A1 | 11/2004 | Iwata et al. | |
| 2004/0252554 A1 | 12/2004 | Fournel et al. | |

FOREIGN PATENT DOCUMENTS

| | | |
|---|---|---|
| JP | 06-076582 | 3/1994 |
| JP | 06-231587 | 8/1994 |
| JP | 2001-156188 | 6/2001 |
| JP | 2002-237540 | 8/2002 |
| WO | WO2004/057621 | 7/2004 |
| WO | 2006/093629 | 9/2006 |

* cited by examiner

*Primary Examiner*—Anh Phung
(74) *Attorney, Agent, or Firm*—Ladas & Parry LLP

(57) ABSTRACT

A nonvolatile semiconductor memory device includes a latch configured to store data, a plurality of word lines, a driver configured to activate one of the plurality of word lines, and a plurality of nonvolatile memory cells coupled to the respective word lines, each of the nonvolatile memory cells coupled to the latch so as to exchange stored data with the latch upon activation of a corresponding one of the word lines, each of the nonvolatile memory cells including two MIS transistors and configured to store data as an irreversible change of transistor characteristics occurring in one of the two MIS transistors, wherein the driver includes at least one nonvolatile memory cell storing count data responsive to a number of times storing of data has been performed with respect to the plurality of nonvolatile memory cells, and is configured to activate one of the word lines indicated by the count data.

8 Claims, 25 Drawing Sheets

FIG.9

| STATE | STC0 | STC1 | STC2 | STC3 | NVWL0 | NVWL1 | NVWL2 | NVWL3 | OVER |
|---|---|---|---|---|---|---|---|---|---|
| INITIAL | 0 | 0 | 0 | 0 | 0 | 0 | 0 | 0 | 0 |
| 1st STORE | 1 | 0 | 0 | 0 | 1 | 0 | 0 | 0 | 0 |
| 2nd STORE | 1 | 1 | 0 | 0 | 0 | 1 | 0 | 0 | 0 |
| 3rd STORE | 1 | 1 | 1 | 0 | 0 | 0 | 1 | 0 | 0 |
| 4th STORE | 1 | 1 | 1 | 1 | 0 | 0 | 0 | 1 | 0 |
| 5th STORE | 1 | 1 | 1 | 1 | 0 | 0 | 0 | 0 | 1 |

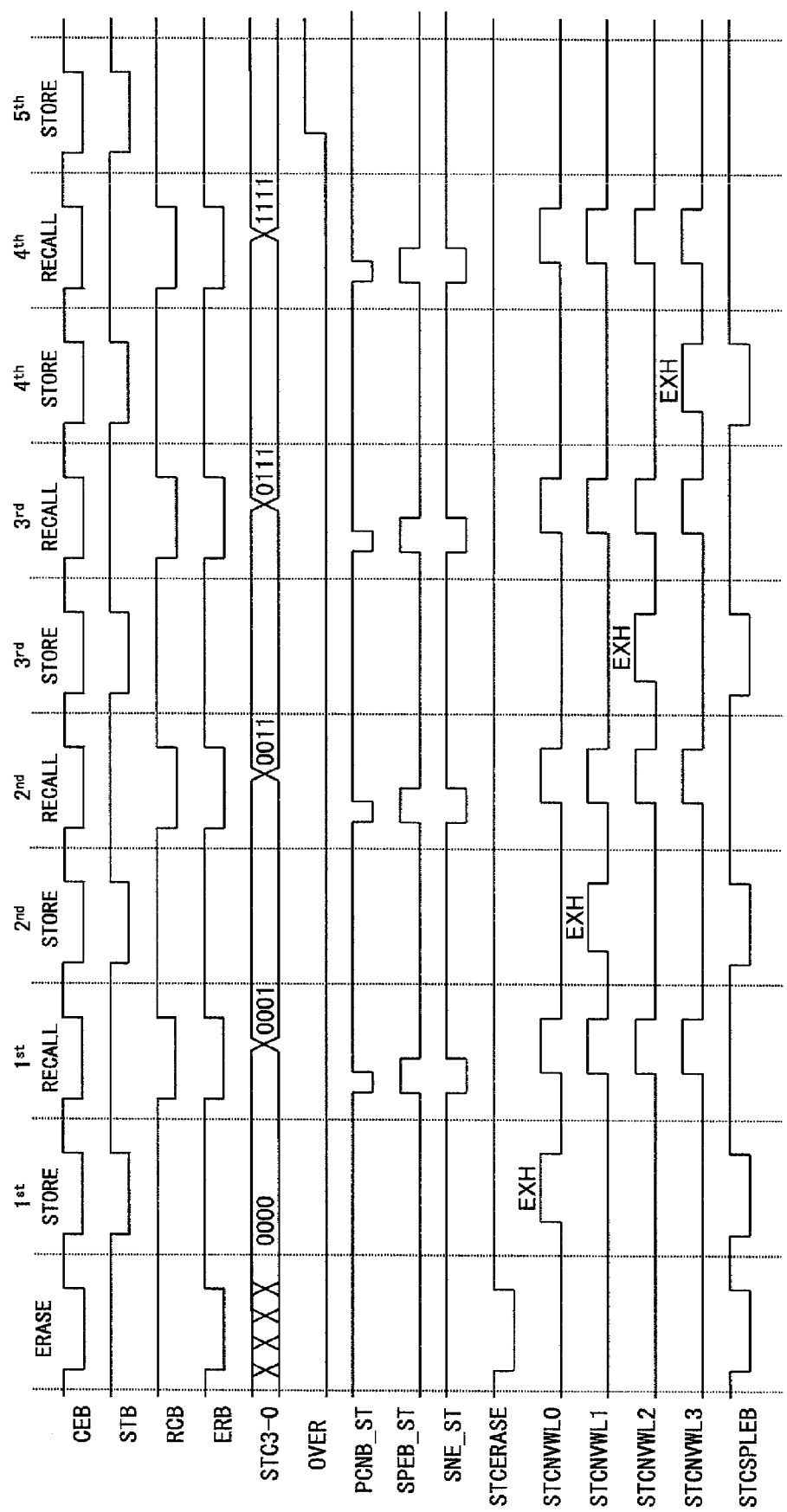

NONVOLATILE MEMORY UTILIZING MIS MEMORY TRANSISTORS CAPABLE OF MULTIPLE STORE OPERATIONS

BACKGROUND OF THE INVENTION

1. Field of the Invention

The present invention generally relates to a memory circuit, and particularly relates to a nonvolatile memory circuit which is capable of retaining stored data in the absence of a power supply voltage.

2. Description of the Related Art

Nonvolatile semiconductor memory devices, which can retain stored data even when power is turned off, conventionally include flash EEPROM employing a floating gate structure, FeRAM employing a ferroelectric film, MRAMs employing a ferromagnetic film, etc. There is a new type of nonvolatile semiconductor memory device called Perm-SRAM. PermSRAM uses a pair of MIS (metal-insulating film-semiconductor) transistors as a nonvolatile memory cell (i.e., the basic unit of data storage). The MIS transistors used as a nonvolatile memory cell in PermSRAM have the same structure as ordinary MIS transistors used for conventional transistor functions (e.g., switching function), and do not require a special structure such as a floating gate or a special material such as a ferroelectric material or ferromagnetic material. The absence of such a special structure and special material offers an advantage in cost reduction. PermSRAM was initially disclosed in PCT/JP2003/016143, which was filed on Dec. 17, 2003, the entire contents of which are hereby incorporated by reference.

The MIS transistors used as a nonvolatile memory cell in PermSRAM are configured to experience an irreversible hot-carrier effect on purpose for storage of one-bit data. Here, the irreversible hot-carrier effect refers to the injection of electrons into the oxide film. A difference in the transistor characteristics caused by the hot-carrier effect represents one-bit data "0" or "1". Such a difference may be detected as a difference in the ON current between the two transistors by using a sensing circuit such as a one-bit static memory circuit (latch) coupled to the MIS transistor pair.

Since the injection of electrons into the oxide film is permanent, the writing of data to PermSRAM may generally be performed only once. When PermSRAM is used for the purpose of storing a program in a computer system, for example, the user may wish to rewrite the stored program for purposes such as modification or update.

There is thus a need for PermSRAM that allows the writing of data to be performed multiple times.

SUMMARY OF THE INVENTION

It is a general object of the present invention to provide a nonvolatile semiconductor memory device that substantially obviates one or more problems caused by the limitations and disadvantages of the related art.

It is another and more specific object of the present invention to provide a PermSRAM that allows the writing of data to be performed multiple times.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

To achieve these and other advantages in accordance with the purpose of the invention, the invention provides a nonvolatile semiconductor memory device which includes a latch configured to store data, a plurality of word lines, a driver configured to activate one of the plurality of word lines, and a plurality of nonvolatile memory cells coupled to the respective word lines, each of the nonvolatile memory cells coupled to the latch so as to exchange stored data with the latch upon activation of a corresponding one of the word lines, each of the nonvolatile memory cells including two MIS transistors and configured to store data as an irreversible change of transistor characteristics occurring in one of the two MIS transistors, wherein the driver includes at least one nonvolatile memory cell storing count data responsive to a number of times storing of data has been performed with respect to the plurality of nonvolatile memory cells, and is configured to activate one of the word lines indicated by the count data.

According to at least one embodiment of the present invention, the driver includes the nonvolatile memory cell for storing the count data responsive to the number of times the storing of data has been performed with respect to the plurality of nonvolatile memory cells, and activates one of the word lines indicated by the count data. This can serve to identify one of the word lines corresponding to the most recent data stored in the nonvolatile memory cells. The activation of one of the word lines indicated by the count data thus makes it possible to correctly recall the most recently stored data even when the storing of data has been performed multiple times with respect to the plurality of nonvolatile memory cells.

BRIEF DESCRIPTION OF THE DRAWINGS

Other objects and further features of the present invention will be apparent from the following detailed description when read in conjunction with the accompanying drawings, in which:

FIG. 9 is a table chart showing changes in various signals as the storing of data in the NV cell units is performed multiple times;

FIG. 25 is a timing chart showing the signal levels of relevant signals with respect to a plurality of store/recall operations.

DESCRIPTION OF THE PREFERRED EMBODIMENTS

In the following, embodiments of the present invention will be described with reference to the accompanying drawings.

The present invention is directed to PermSRAM. Namely, a memory cell includes a pair of MIS (metal-insulating film-semiconductor) transistors that have the same structure as ordinary MIS transistors used for conventional transistor functions (e.g., switching function). Namely, these memory cell transistors use neither a special structure such as a floating gate nor a special material such as a ferroelectric material or a ferromagnetic material. These MIS transistors are configured to experience a hot-carrier effect on purpose for storage of one-bit data.

The hot-carrier effect leaves an irreversible lingering change in the transistor characteristics. Changes in the characteristics of the MIS transistors caused by the hot-carrier effect achieve a nonvolatile data retention. Which one of the MIS transistors has a strong lingering change determines whether the stored data is "0" or "1".

Further, a latch (flip-flop) circuit is used to determine data to be stored in the memory-cell MIS transistors. The latch circuit is also used to read (sense) the data stored in the memory-cell MIS transistors. The latch circuit and the memory-cell MIS transistors together constitute a memory cell (memory circuit).

Figure 1:
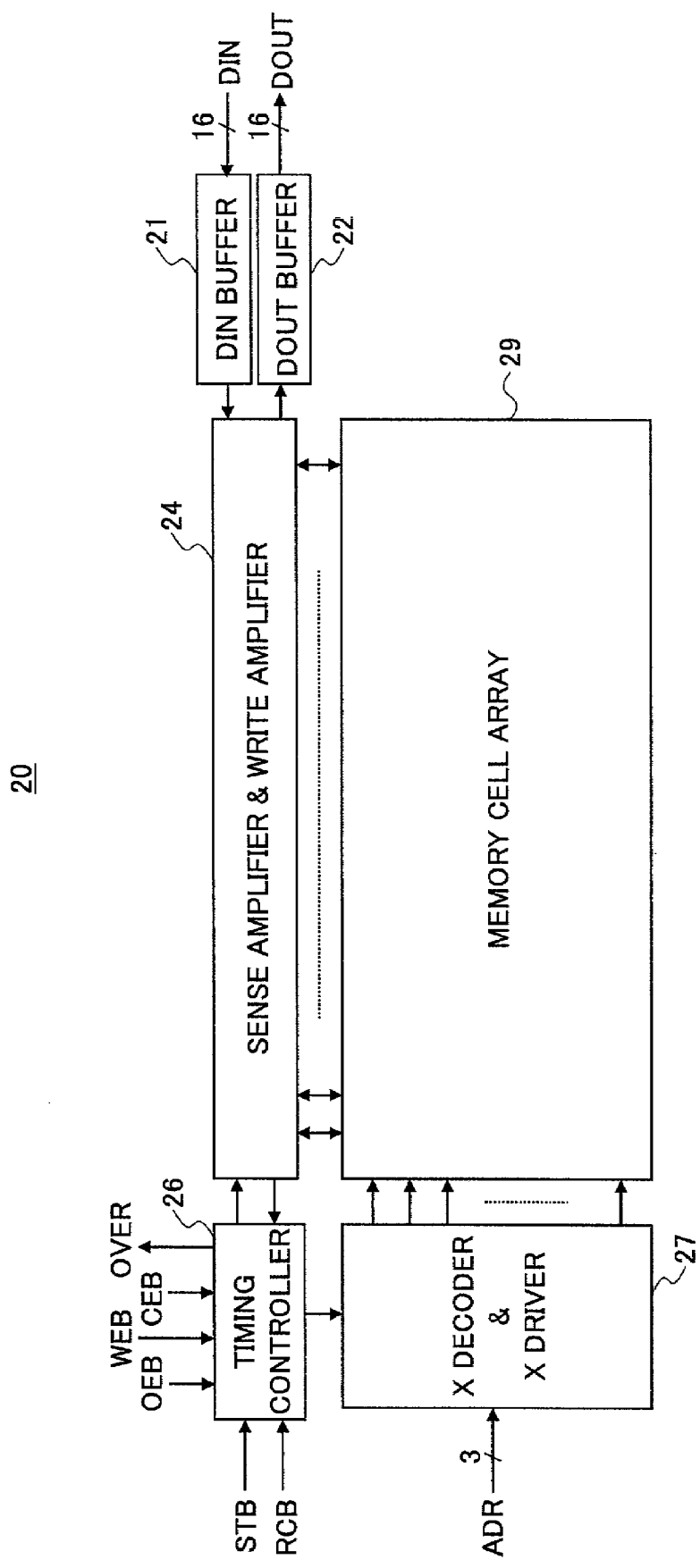
FIG. 1 is a block diagram showing an example of the configuration of a nonvolatile semiconductor memory device according to the present invention.

FIG. 1 is a block diagram showing an example of the configuration of a nonvolatile semiconductor memory device according to the present invention. A semiconductor memory device 20 shown in FIG. 2 includes a Din buffer 21, a Dout buffer 22, a write-amplifier-&-sense-amplifier unit 24, a timing controller 26, an X-decoder-&-X-driver unit 27, and a memory cell array 29.

The memory cell array 29 includes a plurality of memory cells arranged in a matrix form, with a plurality of word lines extending in a first direction, and a plurality of bit lines extending in a second direction perpendicular to the first direction. Each memory cell has a circuit configuration as will later be described. The memory cells arranged in the same column are connected to the same bit lines, and the memory cells arranged in the same row are connected to the same word line.

The timing controller 26 receives control signals from outside the device, and decodes the control signals to determine an operation mode (e.g., a write operation mode or a read operation mode). These control signals include a store enable signal STB, a recall enable signal RCB, an output enable signal OEB, a write enable signal WEB, and a chip enable signal CEB. Timing control signals responsive to the determined operation mode are supplied from the timing controller 26 to the write-amplifier-&-sense-amplifier unit 24 and the X-decoder-&-X-driver unit 27 for control of the individual parts of the semiconductor memory device 20.

The X-decoder-&-X-driver unit 27 includes an X decoder and an X driver. The X decoder receives an X address input from outside the device, and decodes the X address input to determine a selected row. In response to the timing control signals from the timing controller 26 and the decode signals from the X decoder, the X driver activates a selected SRAM word line among the SRAM word lines extending from the X driver. As a result of the activation of the selected SRAM word line, volatile memory units are coupled to respective bit line pairs. Through this coupling, the writing/reading of data to/from the volatile memory portions is performed.

Data read from the memory cell array 29 is supplied to the write-amplifier-&-sense-amplifier unit 24. Sense amplifiers of the write-amplifier-&-sense-amplifier unit 24 amplify the data read from the memory cell array 29 for provision to the Dout buffer 22. The data is output from the Dout buffer 22 to outside the device as output data DOUT. Input data DIN supplied to the Din buffer 21 is provided to the write-amplifier-&-sense-amplifier unit 24. Write amplifiers of the write-amplifier-&-sense-amplifier unit 24 amplify the input data to be written to the memory cell array 29.

Figure 2:
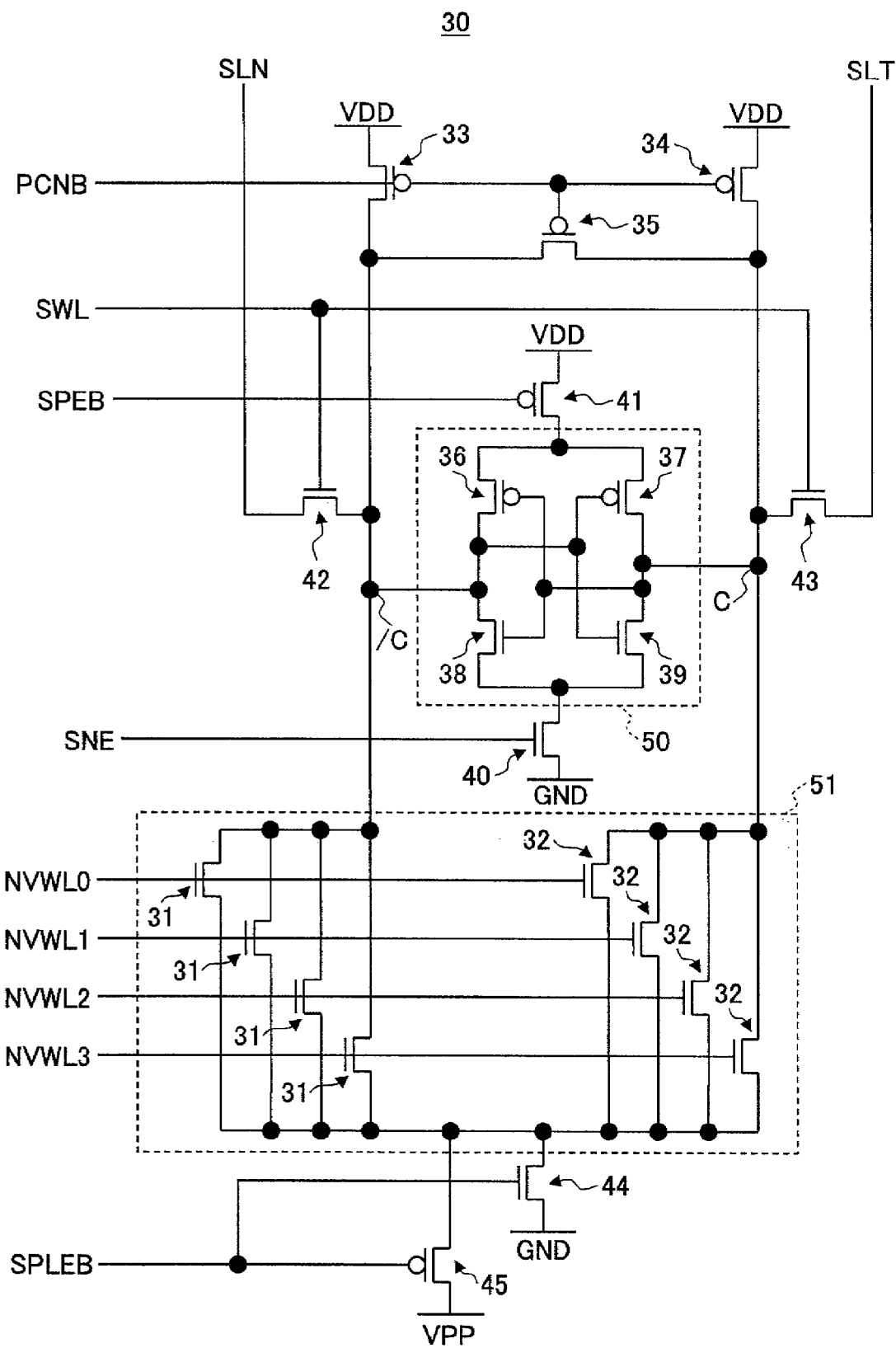
FIG. 2 is an illustrative drawing showing the configuration of a memory cell unit according to an embodiment of the nonvolatile memory device of the present invention.

FIG. 2 is an illustrative drawing showing the configuration of a memory cell unit according to an embodiment of the nonvolatile memory device of the present invention.

A memory cell unit 30 includes a plurality of NMOS transistors 31, a plurality of transistors 32, PMOS transistors 33 through 37, NMOS transistors 38 through 40, a PMOS transistor 41, NMOS transistors 42 through 44, and a PMOS transistor 45. Each of the plurality of NMOS transistors 31 is coupled to a corresponding one of NV (nonvolatile) word lines NVWL0 through NVWL3, and is paired with one of the plurality of NMOS transistors 32 that is coupled to the same NV word line. Any given pair of NMOS transistors 31 and 32 serves as a nonvolatile memory cell. The four pairs of NMOS transistors 31 and 32 together constitute an NV cell unit 51. The number of transistor pairs in the NV cell unit 51 is not limited to four, and may alternatively be any desired number that is two or more. The NMOS transistors 38 and 39 and PMOS transistors 36 and 37 together constitute an SRAM (Static Random Access Memory) cell 50, which is serves as a sensing circuit to sense data stored in the NV cell unit 51. As shown in FIG. 2, two or more pairs of NMOS transistors 31 and 32 (i.e., two or more nonvolatile memory cells) are associated with a single sensing circuit (i.e., SRAM cell 50) in a single memory cell unit 30.

The NMOS transistors 31 and 32 serving as nonvolatile memory cell transistors have the same structure as the other NMOS transistors including the NMOS transistors 38 through 40 used in respect of the SRAM cell 50 and the NMOS transistors 42 and 43 used as a transfer gate between the SRAM cell 50 and SRAM data lines (bit lines) SLN and SLT. Further, it is preferable to manufacture all the MOS transistors of the memory cell unit 30 with the same thickness of the gate oxide film. Namely, all the MOS transistors shown in FIG. 2 may be designed to operate with the same operating voltage (e.g., 1.8 V).

As shown in FIG. 2, the SRAM data lines SLN and SLT, which extend from the write-amplifier-&-sense-amplifier unit 24, are coupled to the SRAM cell 50 via the NMOS transistors 42 and 43 serving as a data transfer unit. An SRAM word line SWL, which extends from the X-decoder-&-X-driver unit 27, is connected to the gates of the NMOS transistors 42 and 43. The NV word lines NVWL0 through NVWL3, which extend from the X-decoder-&-X-driver unit 27, are coupled to the gate nodes of the NMOS transistors 31 and 32 serving as the nonvolatile memory cells. Since there are four nonvolatile memory cells (i.e., four pairs of nonvolatile memory cell transistors) coupled to the four NV word lines NVWL0 through NVWL3, the NV cell unit 51 shown in FIG. 2 can store nonvolatile data four times.

Further, a cell precharge line PCNB, an SRAM NMOS enable line SNE, an SRAM PMOS enable line SPEB, and a store plate voltage enable line SPLEB extend from the X-decoder-&-X-driver unit 27, and are connected to the memory cell unit 30. Specifically, the cell precharge line PCNB is coupled to the gates of the PMOS transistors 33 through 35 for the purpose of precharging and equalizing the node C and /C. The SRAM NMOS enable line SNE and SRAM PMOS enable line SPEB are coupled to the gate of the NMOS transistor 40 and to the gate of the PMOS transistor 41, respectively, so as to control the on/off state of the SRAM cell 50. The store plate voltage enable line SPLEB is coupled to the gate of the NMOS transistor 44. In response to the HIGH state of the store plate voltage enable line SPLEB, the data stored in the NV cell unit 51 is recalled, i.e., the data stored in the NV cell unit 51 is transferred to the SRAM cell 50. The store plate voltage enable line SPLEB is also coupled to the gate of the PMOS transistor 45. In response to the LOW state of the store plate voltage enable line SPLEB, the data stored in the SRAM cell 50 is stored in the NV cell 51.

Figure 3:
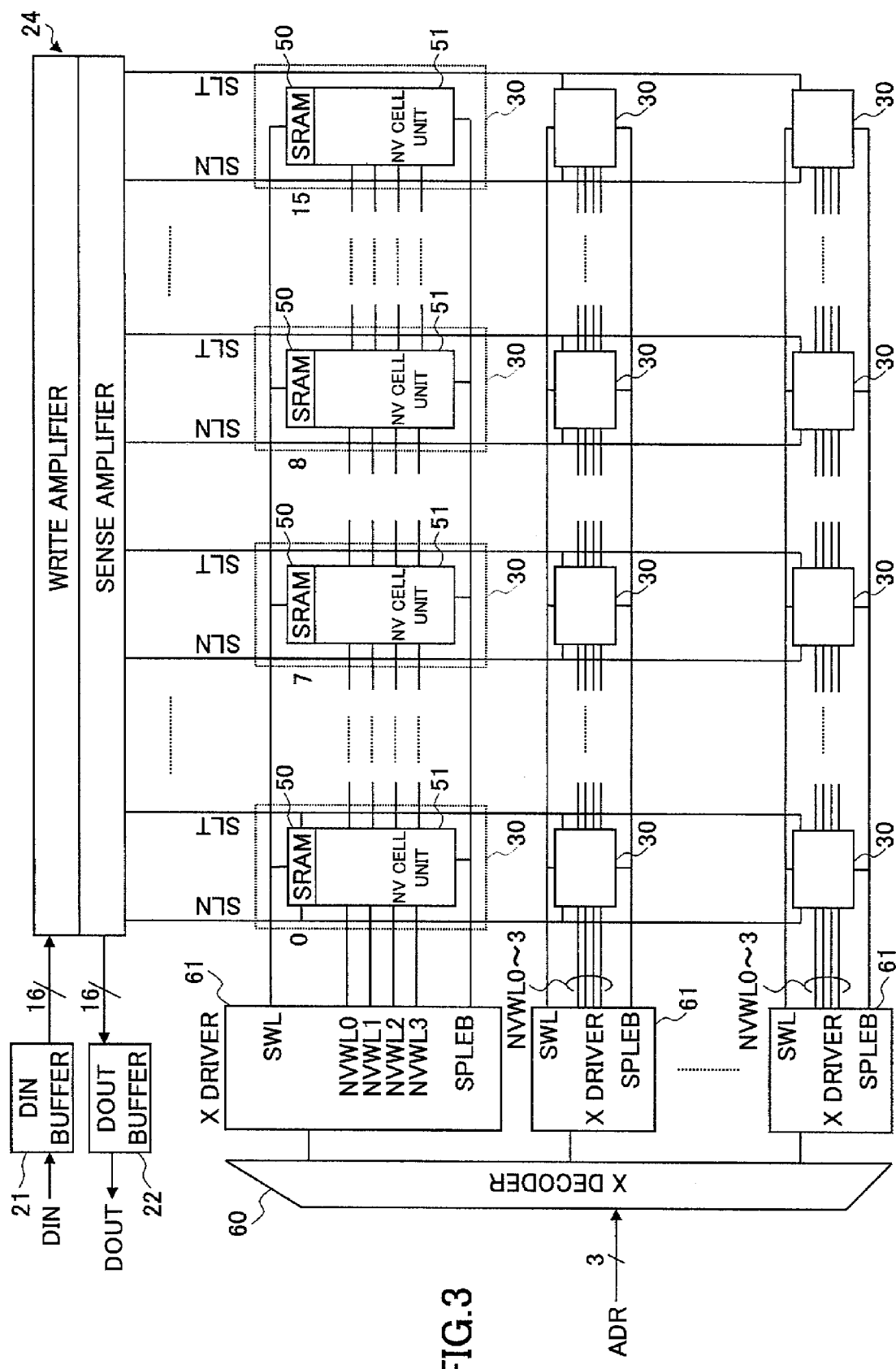
FIG. 3 is a drawing showing a more specific configuration of an X-decoder-&-X-driver unit and a memory cell array shown in FIG. 1.

FIG. 3 is a drawing showing a more specific configuration of the X-decoder-&-X-driver unit 27 and memory cell array 29 shown in FIG. 1. In FIG. 3, the same elements as those of FIG. 1 and FIG. 2 are referred to by the same numerals, and a description thereof will be omitted.

The X-decoder-&-X-driver unit 27 shown in FIG. 1 corresponds to an X decoder 60 and a plurality of X drivers 61. An address signal ADR may be comprised of 3 bits, for example, to select one of the X drivers 61, the number of which is 8 in this example. The memory cell array 29 shown in FIG. 1 corresponds to a plurality of memory cell units 30, the SRAM data lines SLN and SLT extending from write-amplifier-&-sense-amplifier unit 24, and signal lines extending from the X drivers 61. Each of the memory cell units 30 has the configuration as shown in FIG. 2, and includes the SRAM cell 50 and the NV cell unit 51. Some of the signal lines and transistors shown in FIG. 2 are not shown in FIG. 3 for the sake of clarity of illustration.

One of the X drivers 61 selected by the X decoder 60 activates the SRAM word line SWL to read data from or write data to the SRAM cells 50 with respect to the memory cell units 30 that are connected to the activated SRAM word line SWL. Data transfer between the SRAM cells 50 and the write-amplifier-&-sense-amplifier unit 24 is conducted via the SRAM data lines SLN and SLT.

The X drivers 61 activate one of the NV word lines NVWL0 through NVWL3 at the time of storing data from the SRAM cells 50 to the NV cell units 51 or at the time of recalling data to the SRAM cells 50 from the NV cell units 51. Which one of the NV word lines NVWL0 through NVWL3 is activated depends on the state of a counter provided in each of the X drivers 61, which will later be described in detail.

Figure 4:
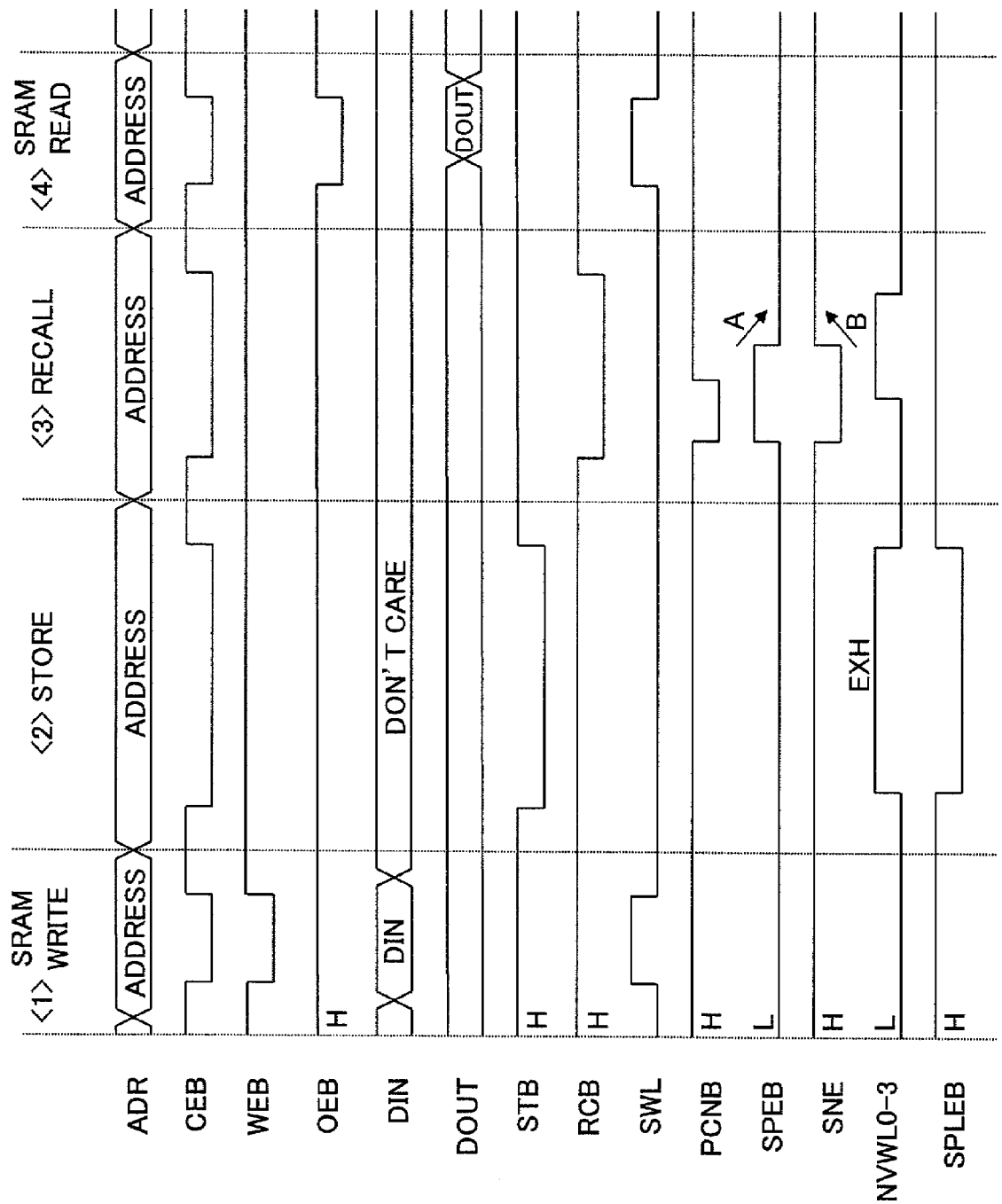
FIG. 4 is a timing chart for explaining operations of the nonvolatile semiconductor memory device of the present invention.

FIG. 4 is a timing chart for explaining operations of the nonvolatile semiconductor memory device of the present invention. The operations of the memory cell shown in FIG. 2 will be described by referring to FIG. 1 through FIG. 4.

The first operation phase shown in FIG. 4 is the writing of data to the SRAM cell 50. The store enable signal STB, the recall enable signal RCB, the output enable signal OEB, the write enable signal WEB, and the chip enable signal CEB are set to respective signal-levels as shown in FIG. 4. The address signal ADR and input data DIN are supplied to the X-decoder-&-X-driver unit 27 and to the Din buffer 21, respectively (see FIG. 1 and FIG. 3). One of the X drivers 61 selected by the X decoder 60 (see FIG. 3) activates the SRAM word line SWL as shown in FIG. 4.

In FIG. 2, the activation of the SRAM word line SWL to HIGH causes the NMOS transistors 42 and 43 to become conductive. Since the SRAM data lines SLN and SLT are at the respective signal levels responsive to the input data DIN, the input data DIN is stored in the SRAM cell 50 through the NMOS transistors 42 and 43. The writing of data to the SRAM cell 50 is performed with respect to all the memory cell units 30 that are connected to the activated SRAM word line SWL (see FIG. 3).

The second operation phase shown in FIG. 4 is the storing of data of the SRAM cells 50 in the NV cell units 51. The store enable signal STB, the recall enable signal RCB, the output enable signal OEB, the write enable signal WEB, and the chip enable signal CEB are set to respective signal levels as shown in FIG. 4.

In FIG. 2, the NMOS transistors 31 and NMOS transistor 32 are conventional MIS (metal-insulating film-semiconductor) transistors designed to operate with a power supply voltage of 1.8 V, for example. Namely, when these transistors are driven with a voltage no greater than 1.8 V, a change in the characteristics due to a hot-carrier effect does not occur from a practical point of view.

The electrical nodes C and /C of the SRAM cell 50 are set to respective potentials that are inverse to each other according to the data stored in the SRAM cell 50. For example, the electrical node C may be set to 0 V, and the electrical node /C may be set to 1.8 V.

As shown in FIG. 4, the store plate voltage enable line SPLEB is then set to LOW (i.e., 0 V), and the potential of one of the NV word lines NVWL0 through NVWL3 is set to EXH, which is a voltage (e.g., 1.65 V) between 0 V and VPP. This NV word line potential EXH is determined such as to maximize the effect of a hot-carrier phenomenon. Generally, such potential is selected to be half the voltage between the source node and drain node of the transistor that is subjected to a hot-carrier effect.

In FIG. 2, with the signal level settings as described above, a voltage of 3.3 V between VPP and the electrical node C is applied between the drain node and source node of one of the NMOS transistors 32. Further, a voltage of 1.65 V between the NV word line potential and the electrical node C is applied between the gate node and source node of this NMOS transistor 32. Since these bias voltages are larger than the voltages used in routine operations, the NMOS transistor 32 experiences a strong hot-carrier effect.

In this situation, only the NMOS transistor 32 experiences a hot-carrier effect. None of the NMOS transistors 31 experiences a hot-carrier effect because a voltage across their drain node and source node is only 1.5 V, which is within the range of voltages used in routine operations.

The third operation phase shown in FIG. 4 is the recalling of data from the NV cell units 51 to the SRAM cells 50. The store enable signal STB, the recall enable signal RCB, the output enable signal OEB, the write enable signal WEB, and the chip enable signal CEB are set to respective signal levels as shown in FIG. 4.

In order to recall (read) the data from the NV cell units 51, the SRAM cells 50 are initially placed in an electrically inactive state, and are then shifted to an electrically active state. This is achieved by shifting the potential of the SRAM PMOS enable line SPEB from 1.8 V to 0 V and the potential of the SRAM NMOS enable line SNE from 0 V to 1.8 V as shown by arrows A and B in FIG. 4. Prior to the activation of the SRAM cell 50, one of the NV word line NVWL0 through NVWL3 is set to 1.8V with the remaining NV word lines being set to 0 V, and the store plate voltage enable line SPLEB is set to VPP.

Turning to FIG. 2, if the relevant one of the NMOS transistors 32 has a lingering change in the characteristics due to a hot-carrier effect whereas the corresponding one of the NMOS transistors 31 does not have such a lingering change in the characteristics, the force that pulls down the electrical node C is weaker than the force that pulls down the electrical node /C. After the activation of the SRAM cell 50, therefore, the electrical node C is set to the HIGH level, and the electrical node /C is set to the LOW level.

On the other hand, if the relevant one of the NMOS transistors 31 has a lingering change in the characteristics due to a hot-carrier effect whereas the corresponding one of the NMOS transistors 32 does not have such a lingering change in the characteristics, the force that pulls down the electrical node /C is weaker than the force that pulls down the electrical node C. After the activation of the SRAM cell 50, therefore, the electrical node /C is set to the HIGH level, and the electrical node C is set to the LOW level.

The fourth operation phase shown in FIG. 4 is the reading of data from the SRAM cell 50. The store enable signal STB, the recall enable signal RCB, the output enable signal OEB, the write enable signal WEB, and the chip enable signal CEB are set to respective signal levels as shown in FIG. 4. The address signal ADR is supplied to the X-decoder-&-X-driver unit 27. One of the X drivers 61 selected by the X decoder 60 (see FIG. 3) activates the SRAM word line SWL as shown in FIG. 4.

In FIG. 2, the activation of the SRAM word line SWL to HIGH causes the NMOS transistors 42 and 43 to become conductive. It follows that the data stored in the SRAM cell 50 appear on the SRAM data lines SLN and SLT through the NMOS transistors 42 and 43. The data appearing on the SRAM data lines SLN and SLT are then output from the Dout buffer 22 as the output data DOUT via the write-amplifier-&-sense-amplifier unit 24 (see FIG. 1 and FIG. 3). It should be noted that the reading of data from the SRAM cell 50 is performed with respect to all the memory cell units 30 that are connected to the activated SRAM word line SWL.

Figure 5:
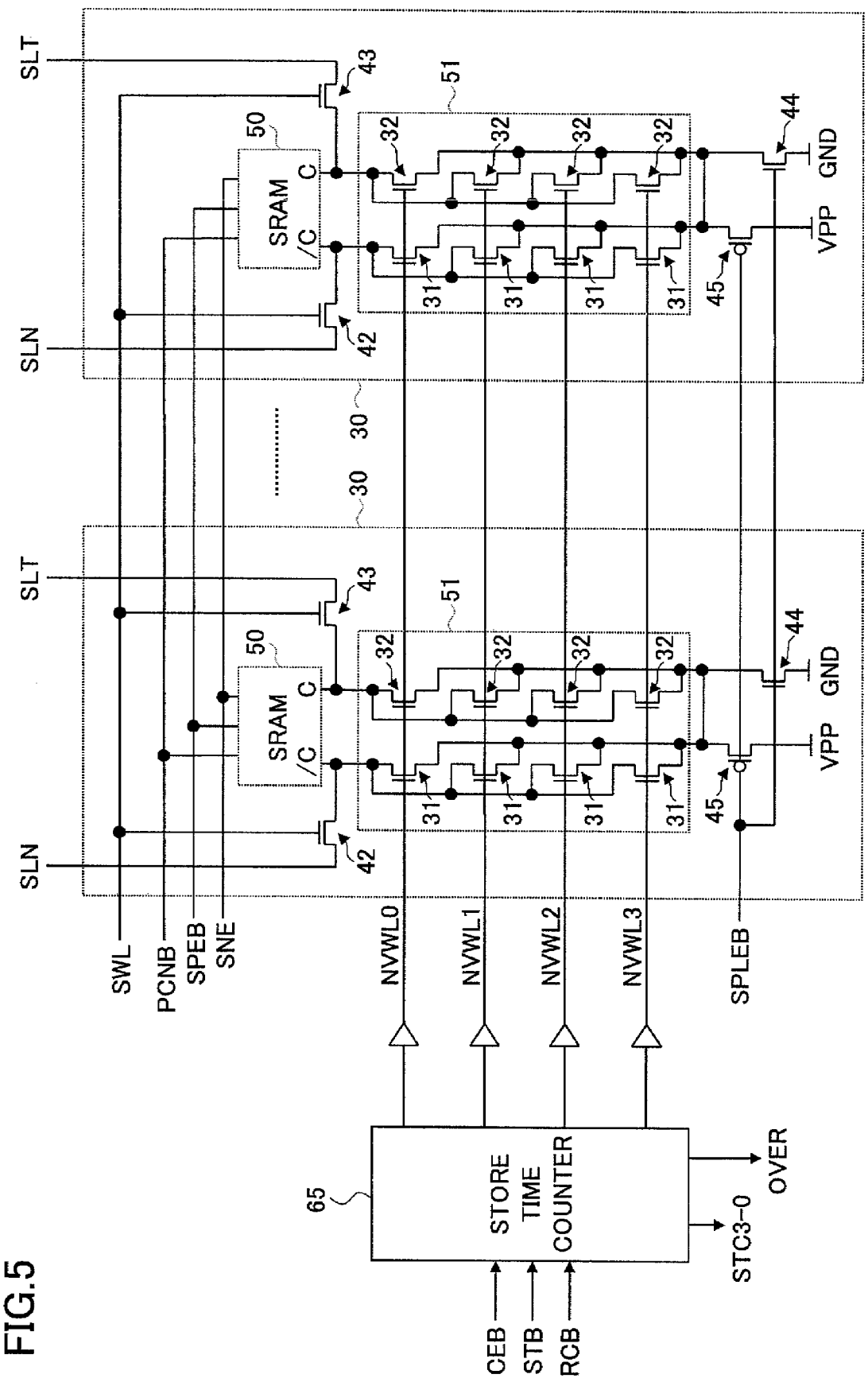
FIG. 5 is a drawing for explaining the relationship between a store time counter and NV cell units.

FIG. 5 is a drawing for explaining the relationship between a store time counter and the NV cell units 51. In FIG. 5, the same elements as those of FIG. 2 and FIG. 3 are referred to by the same numerals, and a description thereof will be omitted.

As previously described, only one of the NV word lines NVWL0 through NVWL3 is activated at a time. Which one is activated depends on the state of a store time counter 65, which is provided in each of the X drivers 61. As shown in FIG. 5, the NV word lines NVWL0 through NVWL3 extend from the store time counter 65, and coupled to the gates of the NMOS transistors 31 and 32 of the NV cell units 51. Since there are four pairs of NMOS transistors provided in each of the NV cell unit 51, the NV cell unit 51 can store nonvolatile data up to four times.

The store time counter 65 is provided for the purpose of recording which one of the NV word lines NVWL0 through NVWL3 corresponds to the currently used pair of NMOS transistors. At the time of recalling data, the store time counter 65 activates one of the NV word lines NVWL0 through NVWL3 that is the same as the one that was activated last time data was stored in the NV cell units 51. At the time of storing data, the store time counter 65 activates one of the NV word lines NVWL0 through NVWL3 that is next following the one that was activated last time data was stored in the NV cell units 51.

Figure 6B:
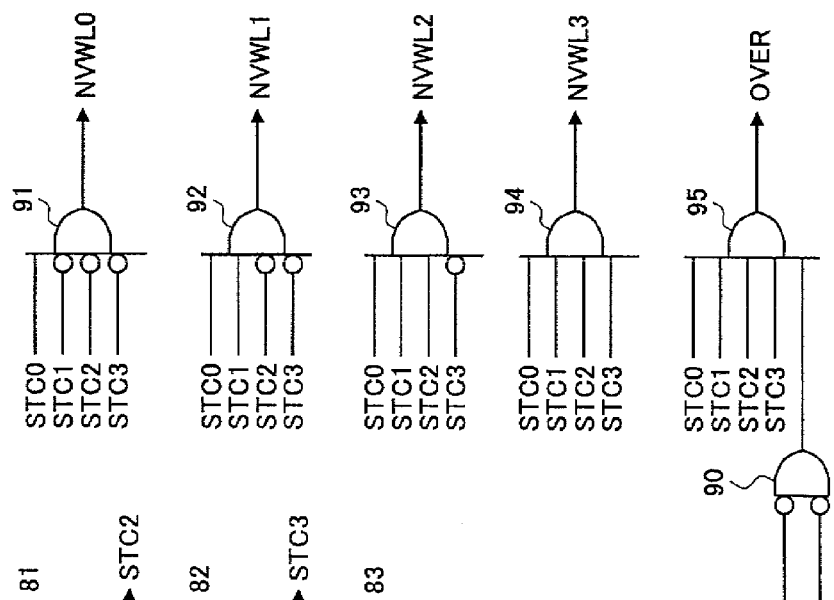
FIGS. 6A and 6B are drawings showing an example of the configuration of the store time counter.
Figure 6A:
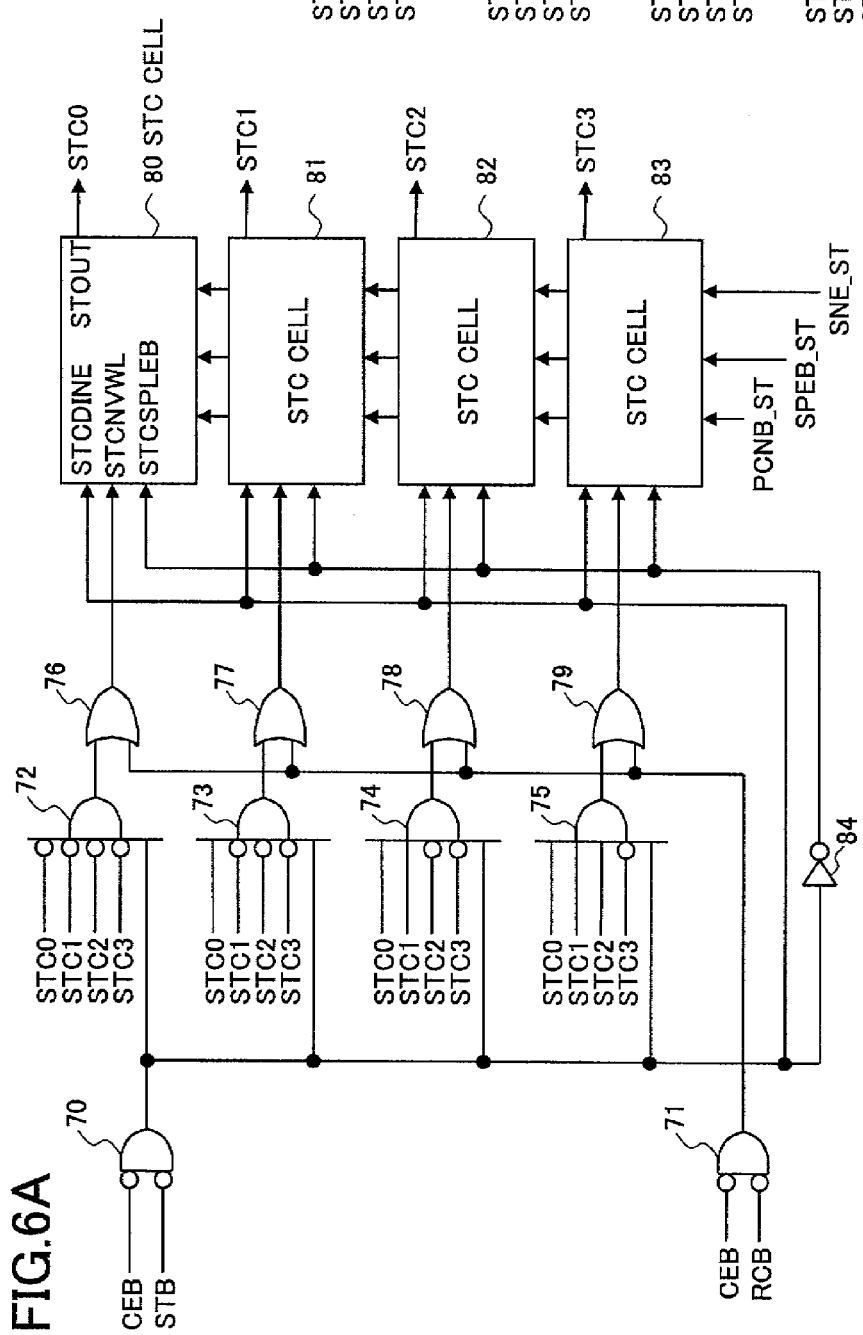

FIGS. 6A and 6B are drawings showing an example of the configuration of the store time counter 65. FIG. 6A shows a counter portion of the store time counter 65, and FIG. 6B shows a decoder portion of the store time counter 65.

The counter portion of the store time counter 65 shown in FIG. 6A includes AND gates 70 through 75, OR gates 76 through 79, STC cells 80 through 83, and an inverter 84. Some of the inputs to the AND gates 70 through 75 are inverted as shown by the open circles attached to the input nodes of these AND gates. The STC cells 80 through 83 are each a one-bit nonvolatile memory cell, and output stored one-bit data STC0 through STC3, respectively.

The AND gate 71 asserts its output in response to simultaneous assertion of both the chip enable signal CEB and the recall enable signal RCB. The output of the AND gate 71 is supplied as an STC NV word line signal STCNVWL to the STC cells 80 through 83 via the respective NOR gates 76 through 79. The STC NV word line signal STCNVWL is thus asserted with respect to all the STC cells 80 through 83 at the time of recall operation.

The AND gate 70 asserts its output in response to the simultaneous assertion of both the chip enable signal CEB and the store enable signal STB. The output of the AND gate 70 is gated by the AND gates 72 through 75, the outputs of which are then supplied as the STC NV word line signal STCNVWL to the STC cells 80 through 83 via the respective NOR gates 76 through 79. Only one of the AND gates 72 through 75, which is selected by a predetermined combination of the STC-cell output signals STC0 through STC3, allows the passage of the output signal of the AND gate 70. The STC NV word line signal STCNVWL is thus asserted with respect to only one of the STC cells 80 through 83 at the time of store operation.

The output of the AND gate 70 is also supplied as an STC Din enable signal STCDINE to the STC cells 80 through 83. An inversion of the output of the AND gate 70 created by the inverter 84 is supplied as an STC store plate voltage enable signal STCSPLEB to the STC cells 80 through 83.

The decoder portion of the store time counter 65 shown in FIG. 6B includes AND gates 90 through 95. Some of the inputs to the AND gates 90 through 95 are inverted as shown by the open circles attached to the input nodes of these AND gates. The AND gates 91 through 95 serve to decode the STC-cell output signals STC0 through STC3 supplied from the STC cells 80 through 83 shown in FIG. 6A, thereby activating one of the NV word lines NVWL0 through NVWL3 and an overflow signal OVER.

Figure 7:
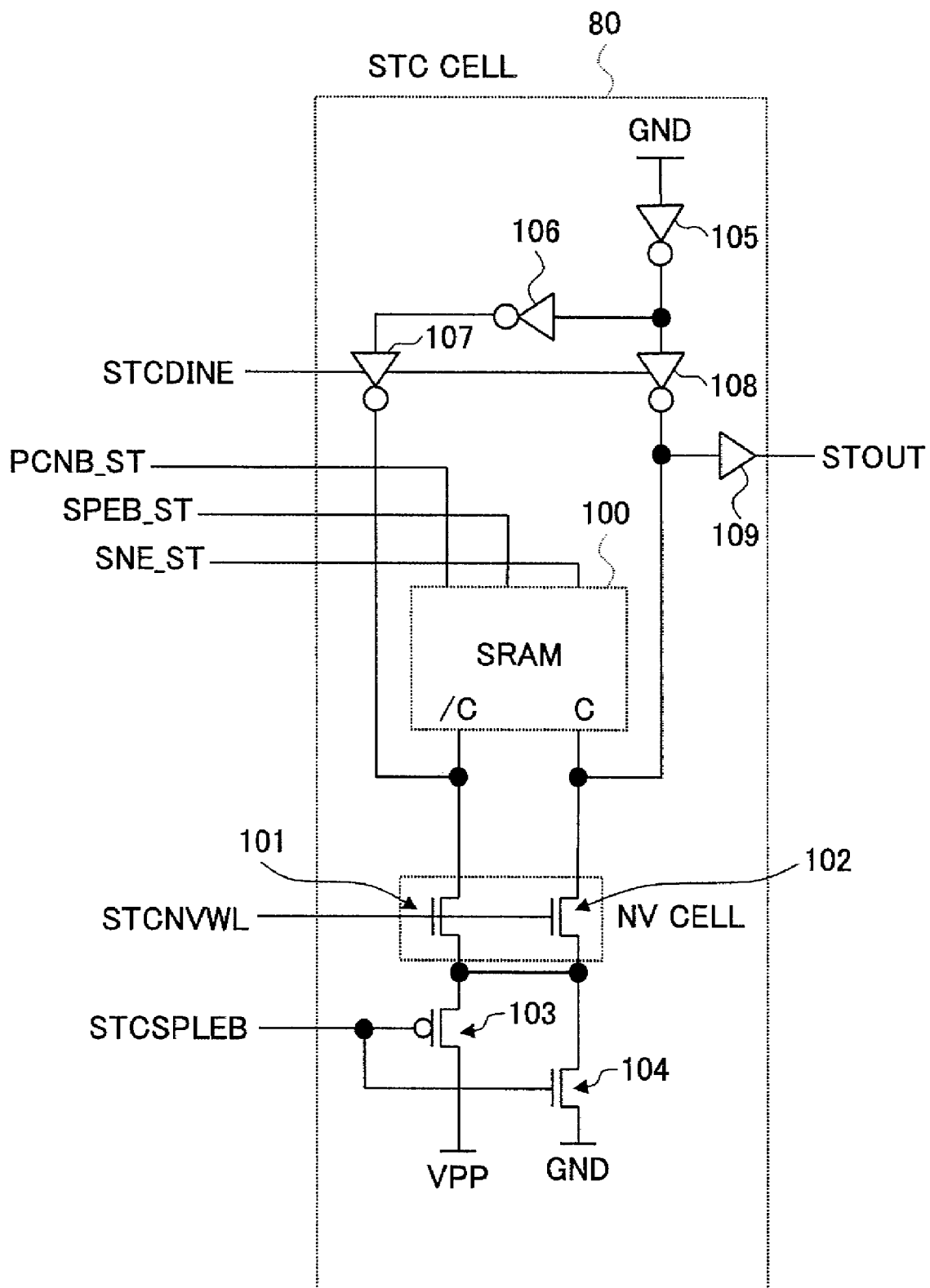
FIG. 7 is a drawing showing an example of the configuration of an STC cell shown in FIG. 6A.

FIG. 7 is a drawing showing an example of the configuration of the STC cell 80 shown in FIG. 6A. In FIG. 7, the STC cell 80 is shown as a representative, and the other STC cells 81 through 83 have the same configuration as the STC cell 80.

The STC cell 80 includes an SRAM 100, NMOS transistors 101 and 102, a PMOS transistor 103, an NMOS transistor 104, inverters 105 through 108, and a buffer 109. The STC cell 80 of this embodiment uses the NMOS transistors 101 and 102 as nonvolatile memory cell transistors in the same manner as the NMOS transistors 31 and 32 in FIG. 2 are uses as nonvolatile memory cell transistors. Namely, the NMOS transistors 101 and 102 are ordinary MIS transistors, and one of them is subjected to the hot-carrier effect to store nonvolatile data as an irreversible change in the transistor characteristics. The SRAM 100 is used as a sensing circuit to sense the data stored in the NMOS transistors 101 and 102 by detecting a difference in electrical property between the NMOS transistors 101 and 102.

The W/L ratio (W: gate width, L: gate length) of the NMOS transistor 102 is larger than the W/L ratio of the NMOS transistor 101. With this configuration, data "0" is output as output data STOUT upon a recall operation in an initial state (i.e., when no store operation has been performed).

A store operation with respect to the NMOS transistors 101 and 102 is performed as follows. The STC Din enable line (signal) STCDINE is activated first, which results in the SRAM 100 being set such that the nodes C and /C are LOW and HIGH. The STC store plate voltage enable line (signal) STCSPLEB is then set to LOW to apply VPP to the NMOS transistors 101 and 102, and an STC NV word line STCN-VWL is set to an appropriate voltage, thereby causing the NMOS transistor 102 to experience a hot-carrier effect.

At the time of data recalling, the STC store plate voltage enable line STCSPLEB is set to HIGH so as to pull down the nodes C and /C to the ground potential GND. Since the NMOS transistor 102 has electrons injected into its oxide film, its power to pull down the node C is weaker than the power of the NMOS transistor 101 to pull down the node /C. This results in the nodes C and /C being set to HIGH and LOW, respectively. After the store operation, thus, a recall operation will read "1" as the output data STOUT.

Figure 8:
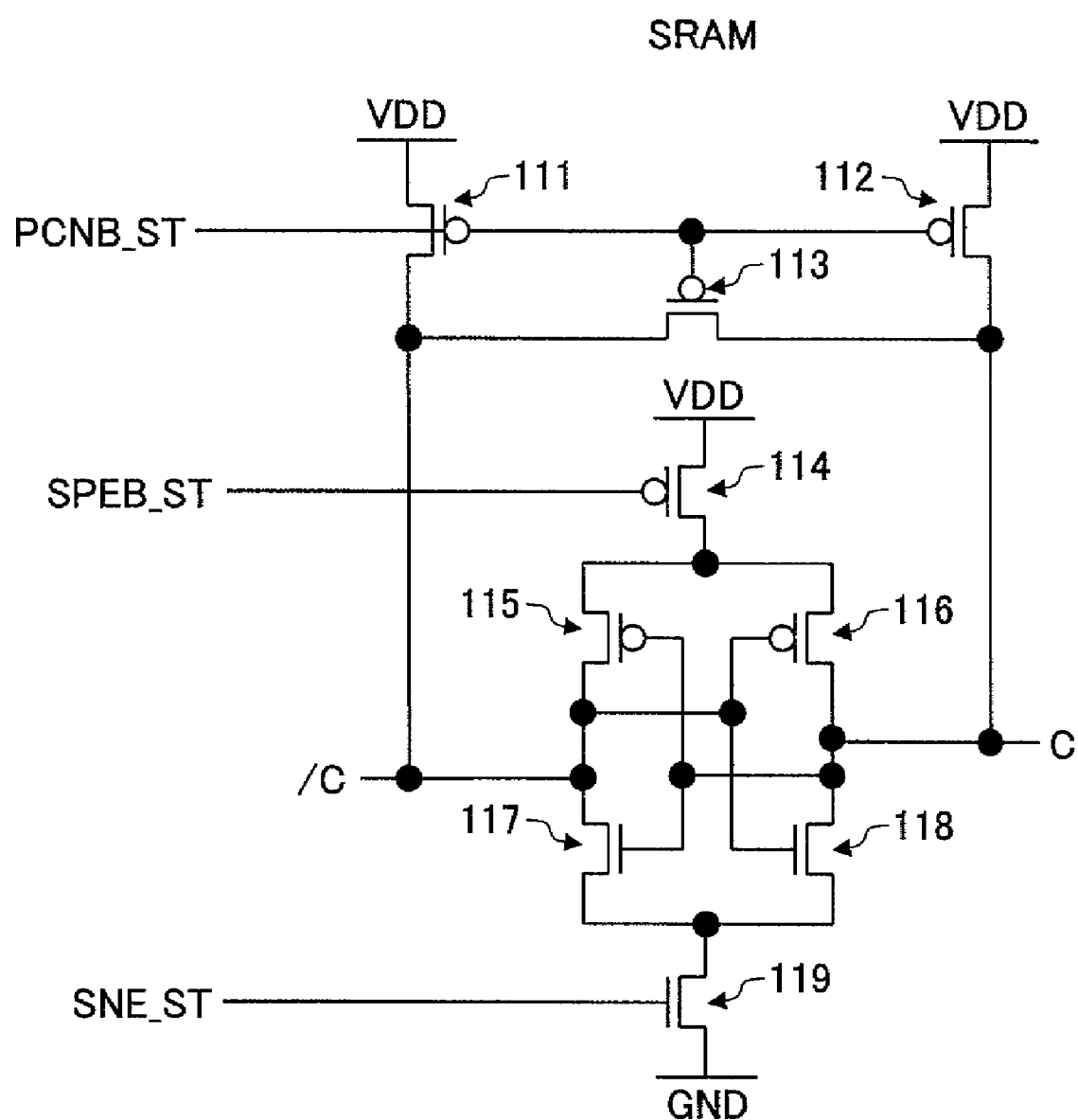
FIG. 8 is a drawing showing an example of the configuration of an SRAM.

FIG. 8 is a drawing showing an example of the configuration of the SRAM 100. As shown in FIG. 8, the SRAM 100 includes PMOS transistors 111 through 116 and NMOS transistors 115 through 119. An STC cell precharge line PCNB_ST is coupled to the gates of the PMOS transistors 111 through 113 for the purpose of precharging and equalizing the node C and /C. The STC SRAM NMOS enable line SNE_ST and STC SRAM PMOS enable line SPEB_ST are coupled to the gate of the NMOS transistor 119 and to the gate of the PMOS transistor 114, respectively, so as to control the on/off state of the SRAM cell.

FIG. 9 is a table chart showing changes in the STC-cell output signals STC0 through STC3, NVWL0 through NVWL3, and OVER as the storing of data in NV cell units 51 is performed multiple times. As shown in FIG. 9, all the STC-cell output signals STC0 through STC3 are set to "0" in the initial state. After the first store operation and at a subsequent recall operation, the STC-cell output signal STC0 is set to "1" while the other STC-cell output signals STC1 through STC3 stay at "0", resulting in the NV word line NVWL0 being activated. After the second store operation and at a subsequent recall operation, the STC-cell output signals STC0 and STC1 are set to "1" while the other STC-cell output signals STC2 and STC3 stay at "0", resulting in the NV word line NVWL1 being activated. After the third store operation and at a subsequent recall operation, the STC-cell output signals STC0 through STC2 are set to "1" while the STC-cell output signal STC3 stays at "0", resulting in the NV word line NVWL2 being activated. After the fourth store operation and at a subsequent recall operation, the STC-cell output signals STC0 through STC3 are set to "1", resulting in the NV word line NVWL3 being activated. At the fifth store operation, the overflow signal OVER is asserted, indicating that the current store operation is an attempt to store data in excess of the number of allowed store operations and thus illegal.

Figure 10:
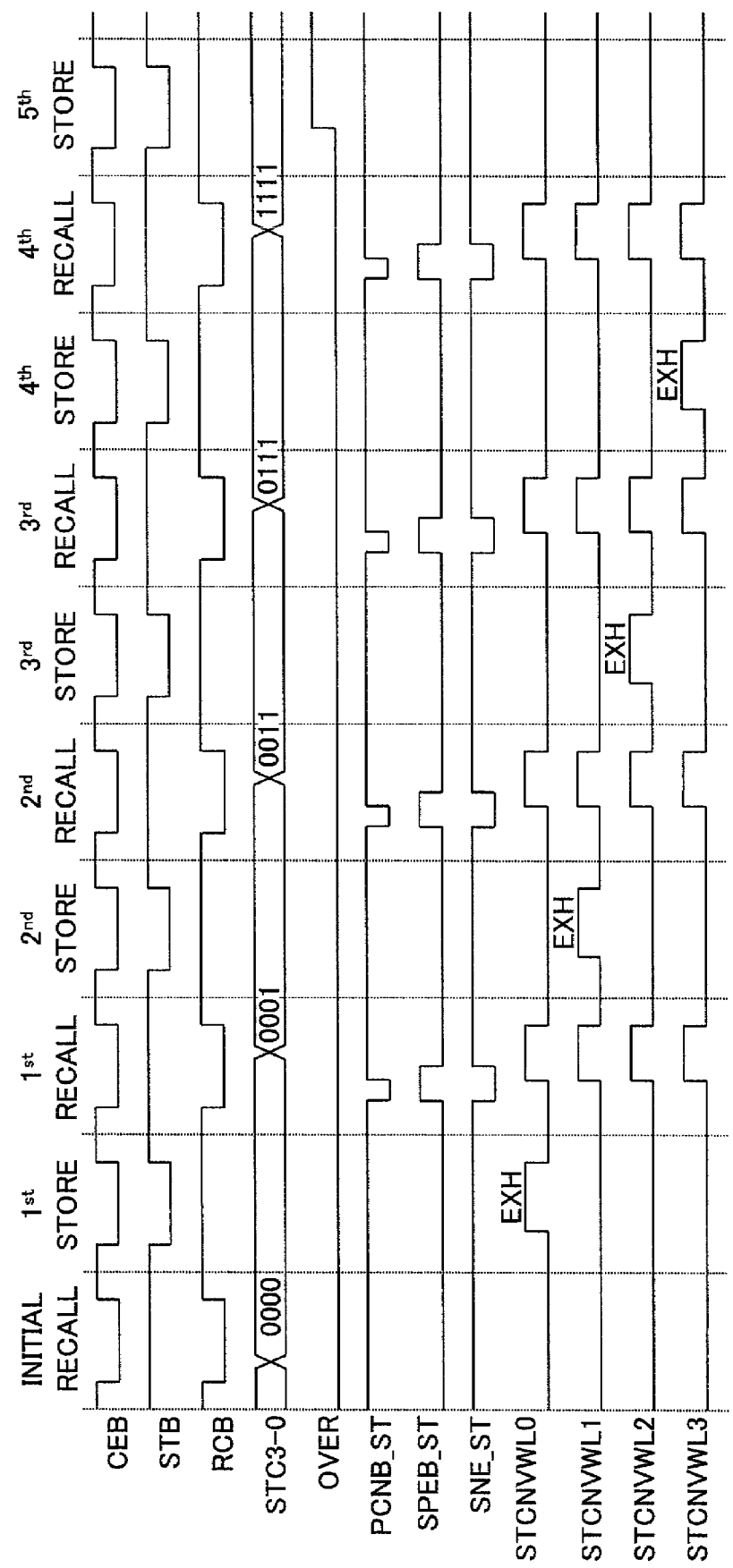
FIG. 10 is a timing chart showing the signal levels of relevant signals with respect to a plurality of store/recall operations.

FIG. 10 is a timing chart showing the signal levels of relevant signals with respect to a plurality of store/recall operations.

Figure 11:
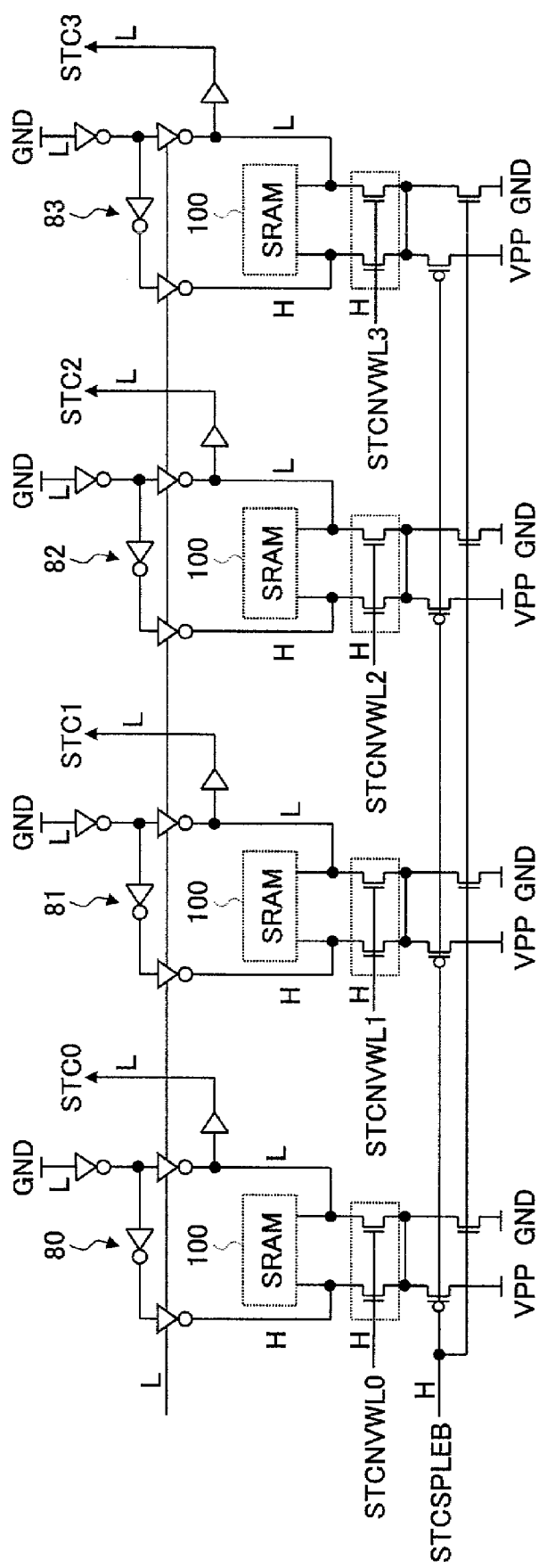
FIG. 11 is a drawing showing the state of STC cells at the time of initial recall operation.

At the initial recall operation shown in FIG. 10, the chip enable signal CEB and the recall enable signal RCB are activated to perform a recall operation, which results in all the STC-cell output signals STC0 through STC3 being set to "0". FIG. 11 is a drawing showing the state of the STC cells 80 through 83 at the time of initial recall operation.

Figure 12:
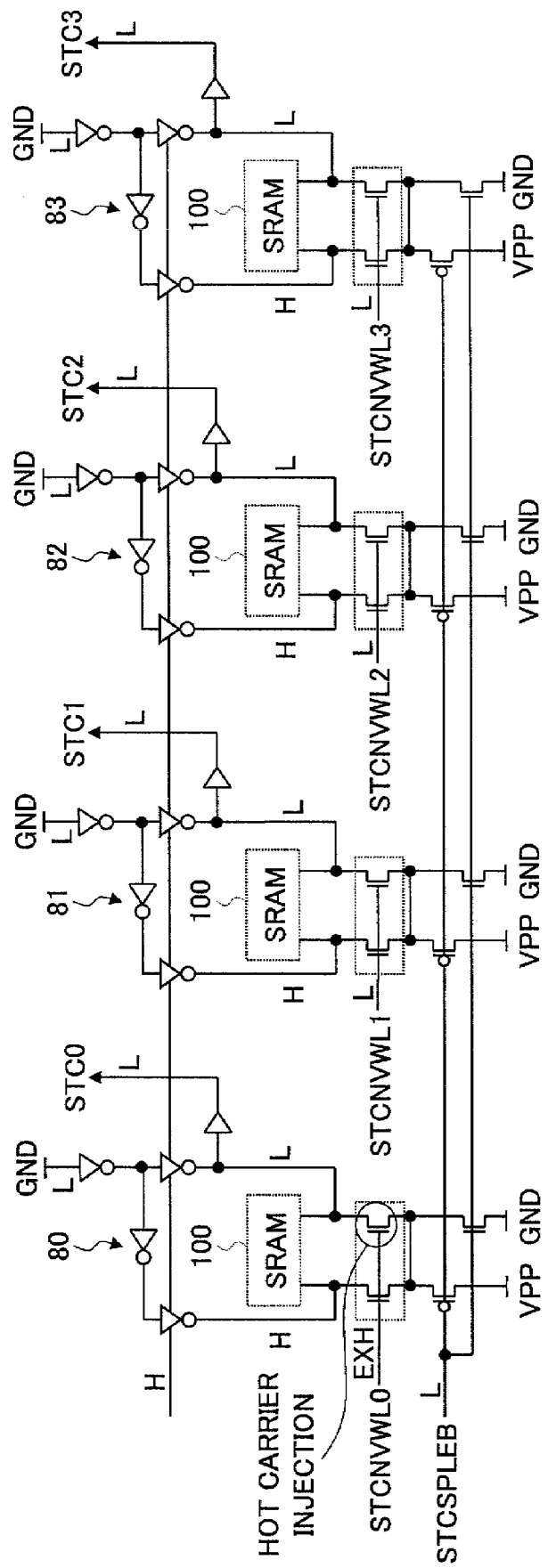
FIG. 12 is a drawing showing the state of the STC cells at the time of the first store operation.

At the first store operation shown in FIG. 10, the chip enable signal CEB and the store enable signal STB are activated to perform a store operation. Since the STC-cell output signals STC0 through STC3 are all "0", only the NOR gate 76 produces a HIGH output, while the other NOR gates 77 through 79 produce a LOW output (see FIG. 6A). As a result, a store operation is performed only with respect to the STC cell 80. FIG. 12 is a drawing showing the state of the STC cells 80 through 83 at the time of the first store operation.

Figure 13:
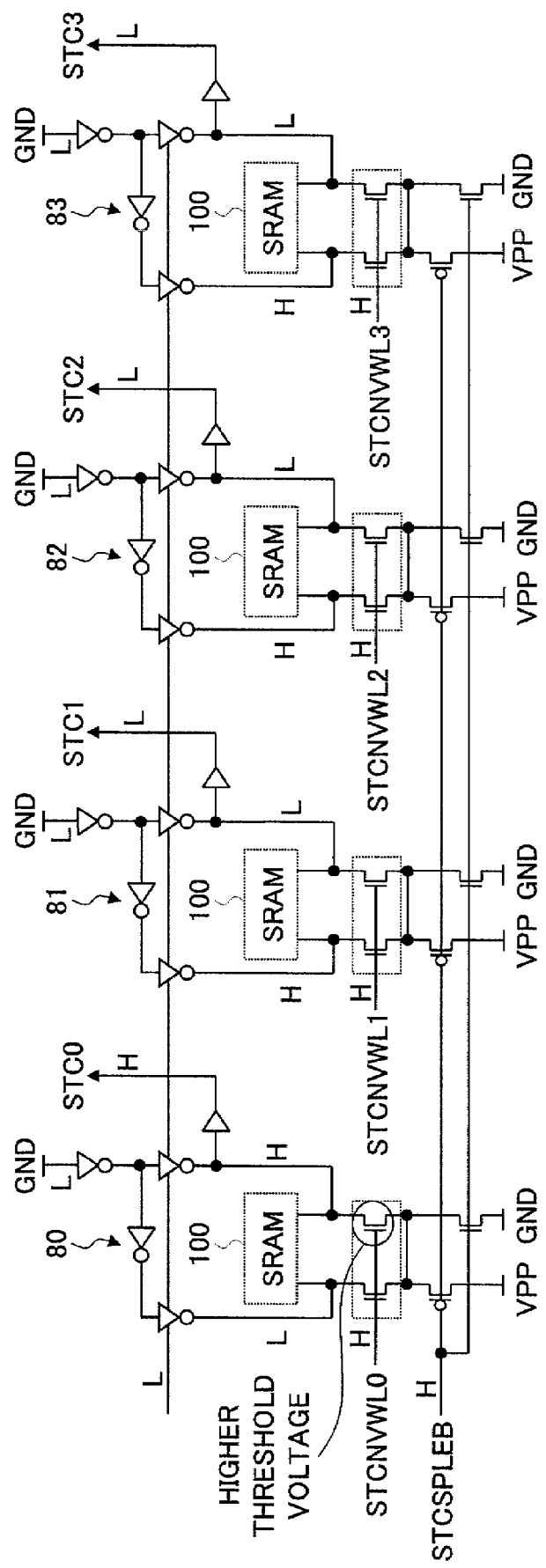
FIG. 13 is a drawing showing the state of the STC cells at the time of initial recall operation.

At the first recall operation shown in FIG. 10, the chip enable signal CEB and the recall enable signal RCB are activated to perform a recall operation, which results in the STC-cell output signal STC0 being set to "1" and all the other signals STC1 through STC3 being set to "0". FIG. 13 is a drawing showing the state of the STC cells 80 through 83 at the time of initial recall operation.

The second and subsequent store/recall operations are performed in the same manner as the first store/recall operation as described above. At the end, the fifth store operation is attempted, resulting in the overflow signal OVER being set to "1" as shown in FIG. 10.

In the manner as described above, the store time counter 65 counts up each time a store operation is performed, thereby shifting the position of the currently activated NV word line one by one (see FIG. 9). That is, one of the NV word lines NVWL0 through NVWL3 is successively activated, and the change of activation occurs each time a store operation is performed. The use of the store time counter 65 thus makes it possible to identify which one of the four nonvolatile transistor pairs of the NV cell unit 51 (see FIG. 2) is currently in use.

It should be noted that in order to store new data, the store operation of the memory cell units 30 should be performed with respect to a next NV word line instead of the current NV word line that is presently activated for recall operation. For example, the STC-cell output signals STC0, STC1, STC2, and STC3 are 1, 1, 0, and 0, respectively, after the second store operation (see FIG. 9), and, thus, the NV word line NVWL1 is activated in this state for recall operatibn. However, a next NV word line NVWL2 should be activated at the time of store operation to store new data in the NV cell unit 51. There are two ways to do this. The first way is to perform the store operation of the store time counter 65 separately from the store operation of the memory cell units 30, so that the NV word line NVWL2 will be activated for the subsequent store operation of the memory cell units 30 that is performed separately from the store operation of the store time counter 65.

The second way is to provide a mechanism to activate a next NV word line NVWL2 instead of the current NV word line NVWL1 at the time of store operation. Such a mechanism can be implemented by use of a simple logic circuit. With this mechanism, the store operation of the store time counter 65 to update the STC-cell output signals can be performed concurrently with the store operation of the memory cell units 30.

Figure 14:
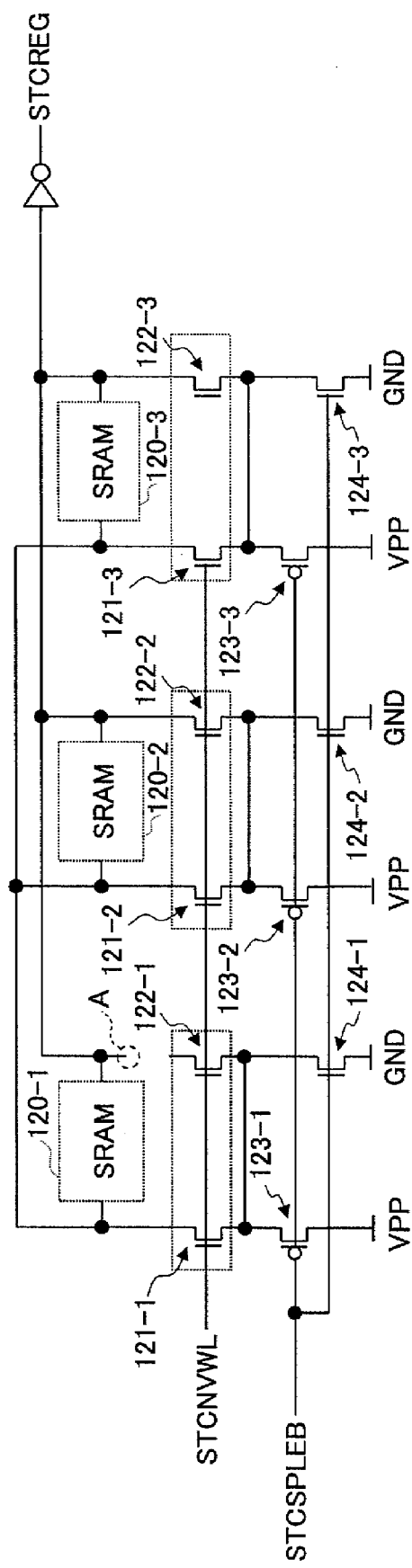
FIG. 14 is a drawing showing a variation of an STC cell for use in the store time counter.

FIG. 14 is a drawing showing a variation of an STC cell for use in the store time counter 65. The STC cell shown in FIG. 14 includes SRAMs 120-1 through 120-3, NMOS transistors 121-1 through 121-3, NMOS transistors 122-1 through 122-3, PMOS transistors 123-1 through 123-3, and NMOS transistors 124-1 through 124-3.

In the case of the STC cell shown in FIG. 7, the W/L ratio is set to different values between the NMOS transistors 101 and 102 to provide a desired initial state. In the case of the STC cell shown in FIG. 14, three SRAMs 120-1 through 120-3, one of which has one node thereof disconnected from the nonvolatile memory transistor, is used to provide a desired initial state. Such a node is shown as a node A in FIG. 14.

In FIG. 14, all the NMOS transistors 121-1 through 121-3 and NMOS transistors 122-1 through 122-3 are designed to have the same transistor characteristics, and thus have substantially the same threshold voltage in the initial state. When the three SRAMs 120-1 through 120-3 are activated, the force to pull down one of the two nodes of the SRAMs is ⅔ of the force to pull down the other one of the two nodes of the SRAMs. As a result, an output signal STCREG will always be LOW in the initial state.

Figures 15A, 15B, 15C:
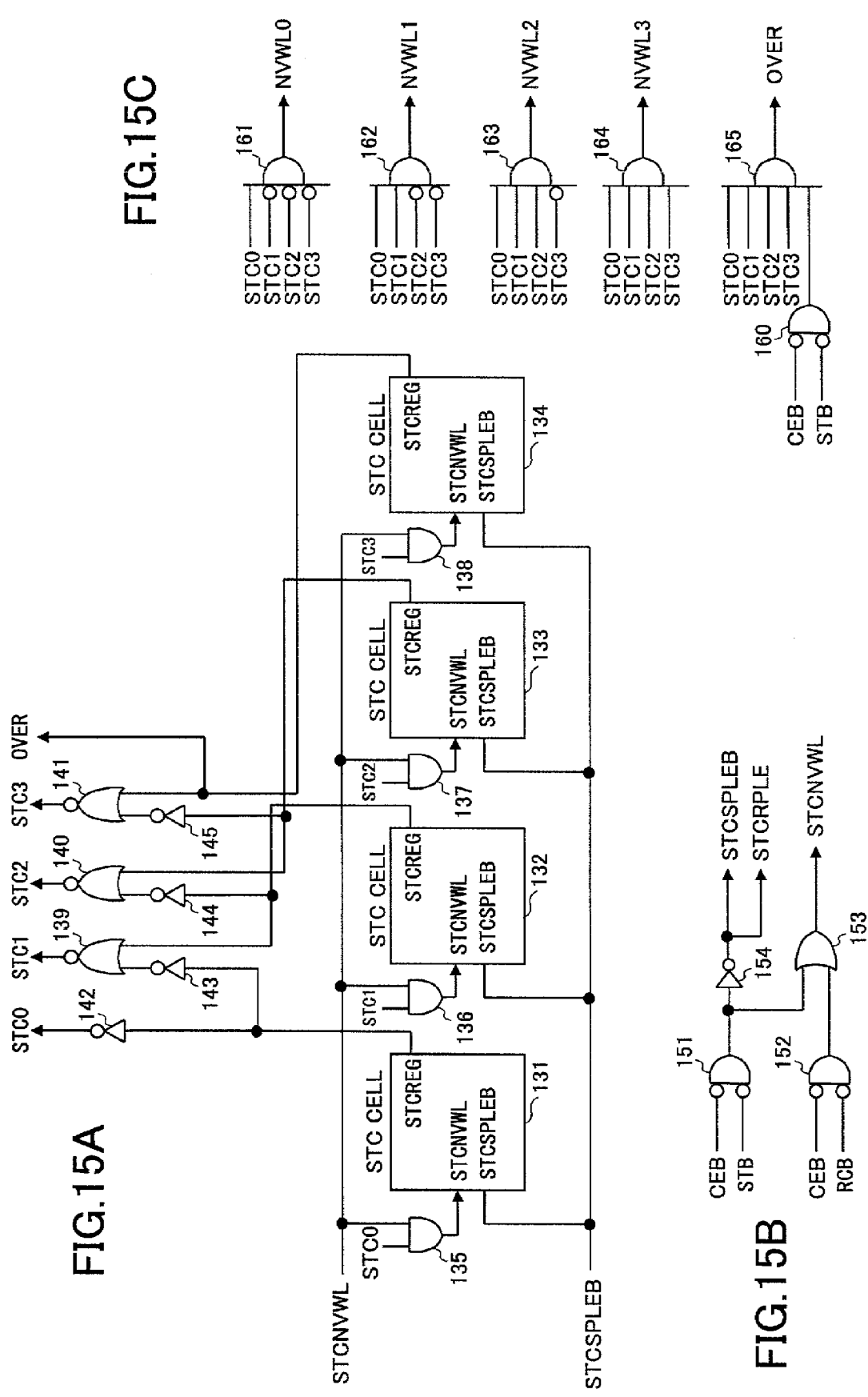
FIGS. 15A through 15C are drawings showing another example of the configuration of the store time counter.

FIGS. 15A through 15C are drawings showing another example of the configuration of the store time counter 65. FIGS. 15A and 15B show a counter portion of the store time counter 65, and FIG. 15C shows a decoder portion of the store time counter 65.

The counter portion of the store time counter 65 shown in FIG. 15A includes STC cells 131 through 134, AND gates 135 through 138, NOR gates 139 through 141, and inverters 142 through 145. Each of the STC cells 131 through 134 has the same configuration as that shown in FIG. 14, and outputs stored one bit data STCREG. Signals STCSPLEB, STCRPLE, and STCNVWL shown in FIG. 15A are generated by a logic circuit shown in FIG. 15B. The logic circuit of FIG. 15B includes AND gates 151 and 152, a NOR gate 153, and an inverter 154. The two inputs to each of the AND gates 151 and 152 are inverted as shown by open circles attached to the respective input nodes.

The decoder portion of the store time counter 65 shown in FIG. 15C includes AND gates 160 through 165. Some of the inputs to the AND gates 160 through 165 are inverted as shown by the open circles attached to the input nodes of these AND gates. The AND gates 161 through 165 serve to decode signals STC0 through STC3 supplied from the counter portion of the store time counter 65 shown in FIG. 15A, thereby activating one of the NV word lines NVWL0 through NVWL3 and an overflow signal OVER.

Figure 16:
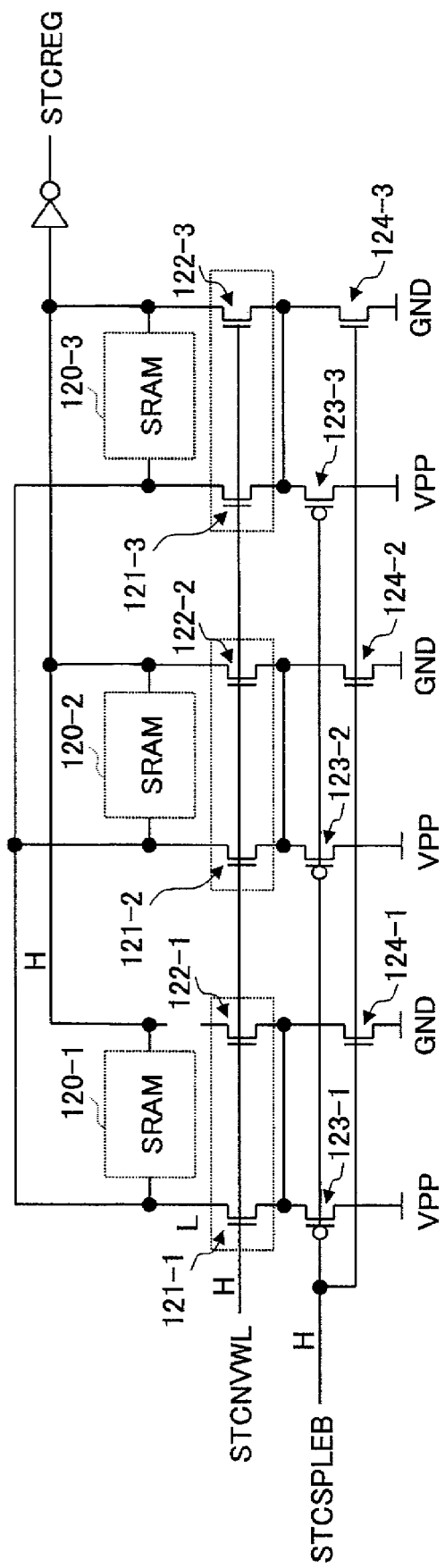
FIG. 16 is a drawing showing the state of an STC cell shown in FIG. 15A at the time of initial recall operation.

FIG. 16 is a drawing showing the state of the STC cell 131 shown in FIG. 15A at the time of initial recall operation. At the initial recall operation, the STC NV word line STCNVWL is set to HIGH, and the STC store plate voltage enable line STCSPLEB is set to HIGH. In this case, the ratio of the forces to pull down the two respective nodes of the SRAMs is 2 to 3. As a result, the output STCREG is set to LOW.

Figure 17:
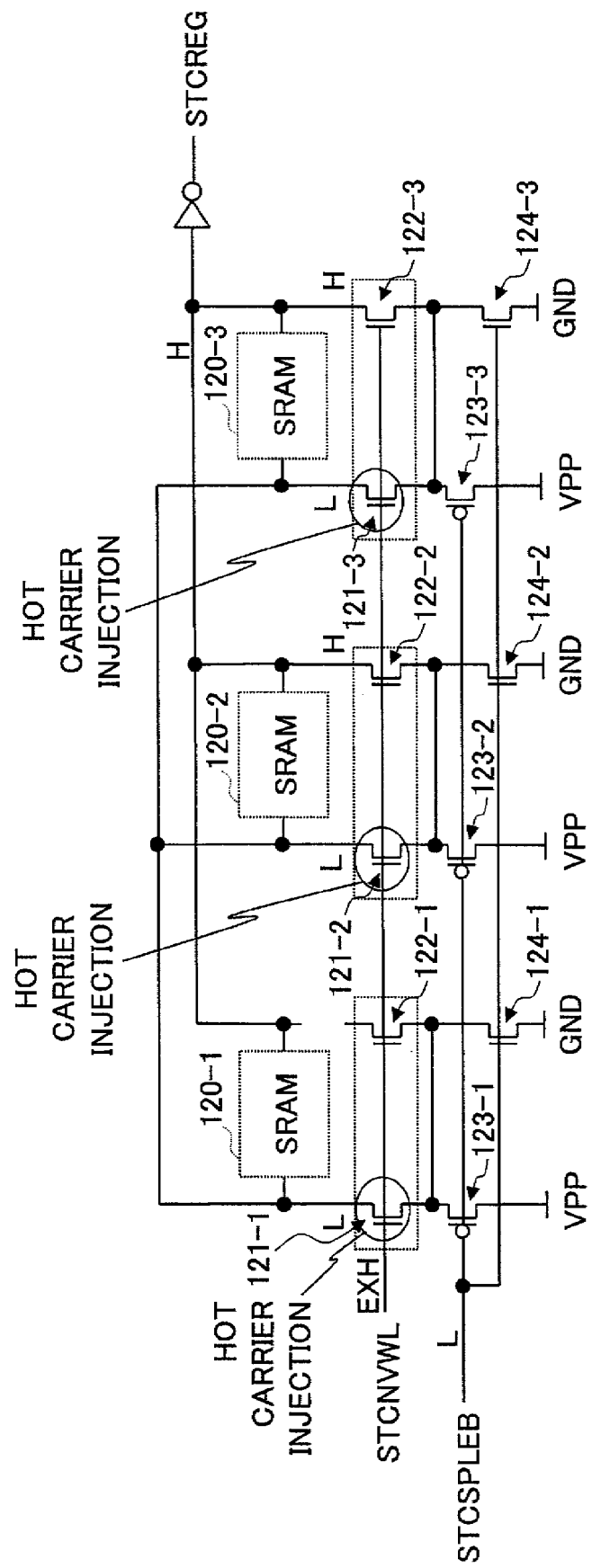
FIG. 17 is a drawing showing the state of an STC cell shown in FIG. 15A at the time of the first store operation.

FIG. 17 is a drawing showing the state of the STC cell 131 shown in FIG. 15A at the time of the first store operation. At the first store operation, the STC NV word line STCNVWL is set to EXH (which is the same as the voltage EXH described in connection with FIG. 4), and the STC store plate voltage enable line STCSPLEB is set to LOW. As a result, hot carrier injection occurs with respect to the NMOS transistors 121-1 through 121-3.

Figure 18:
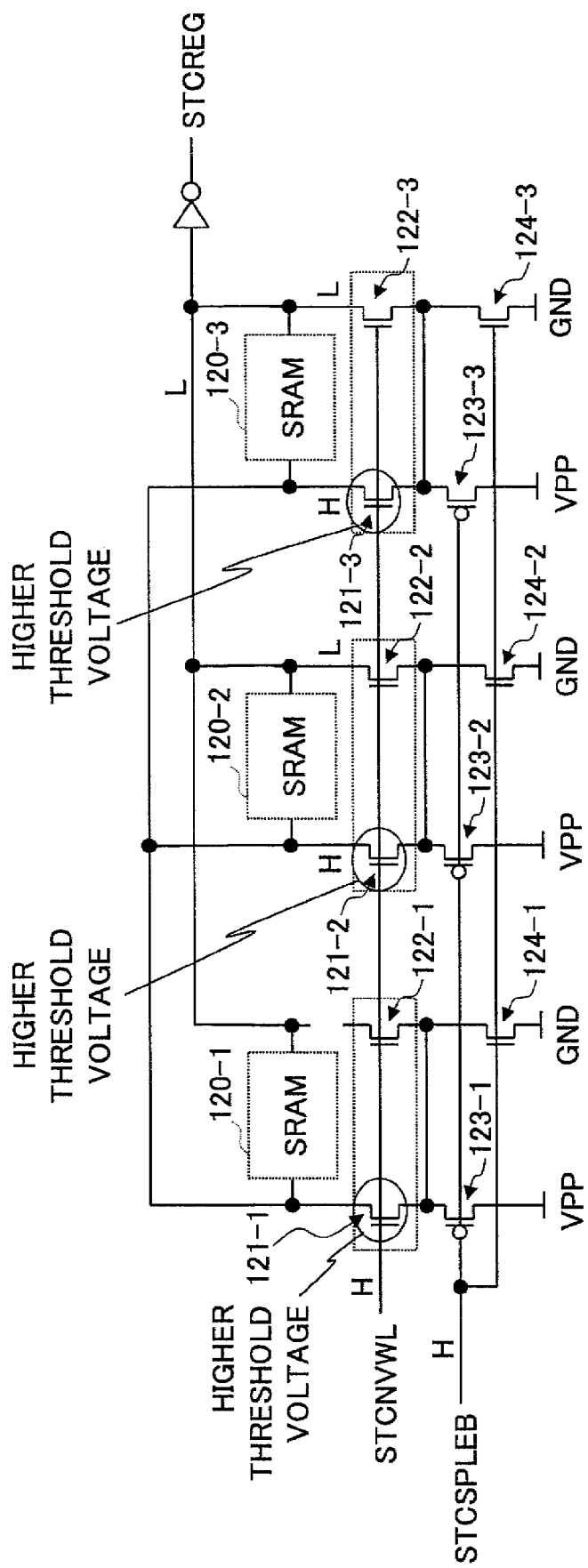
FIG. 18 is a drawing showing the state of an STC cell shown in FIG. 15A at the time of first recall operation.

FIG. 18 is a drawing showing the state of the STC cell 131 shown in FIG. 15A at the time of first recall operation. At the first recall operation, the STC NV word line STCNVWL is set to HIGH, and the STC store plate voltage enable line STCSPLEB is set to HIGH. In this case, the ratio of the forces to pull down the two respective nodes of the SRAMs is 2 to 3X where X is a factor responsive to the decrease in on-current (i.e., increase in threshold voltage) caused by the hot-carrier injection. X is designed such that 3X becomes smaller than 2. As a result, the output STCREG is set to HIGH.

Figure 19:
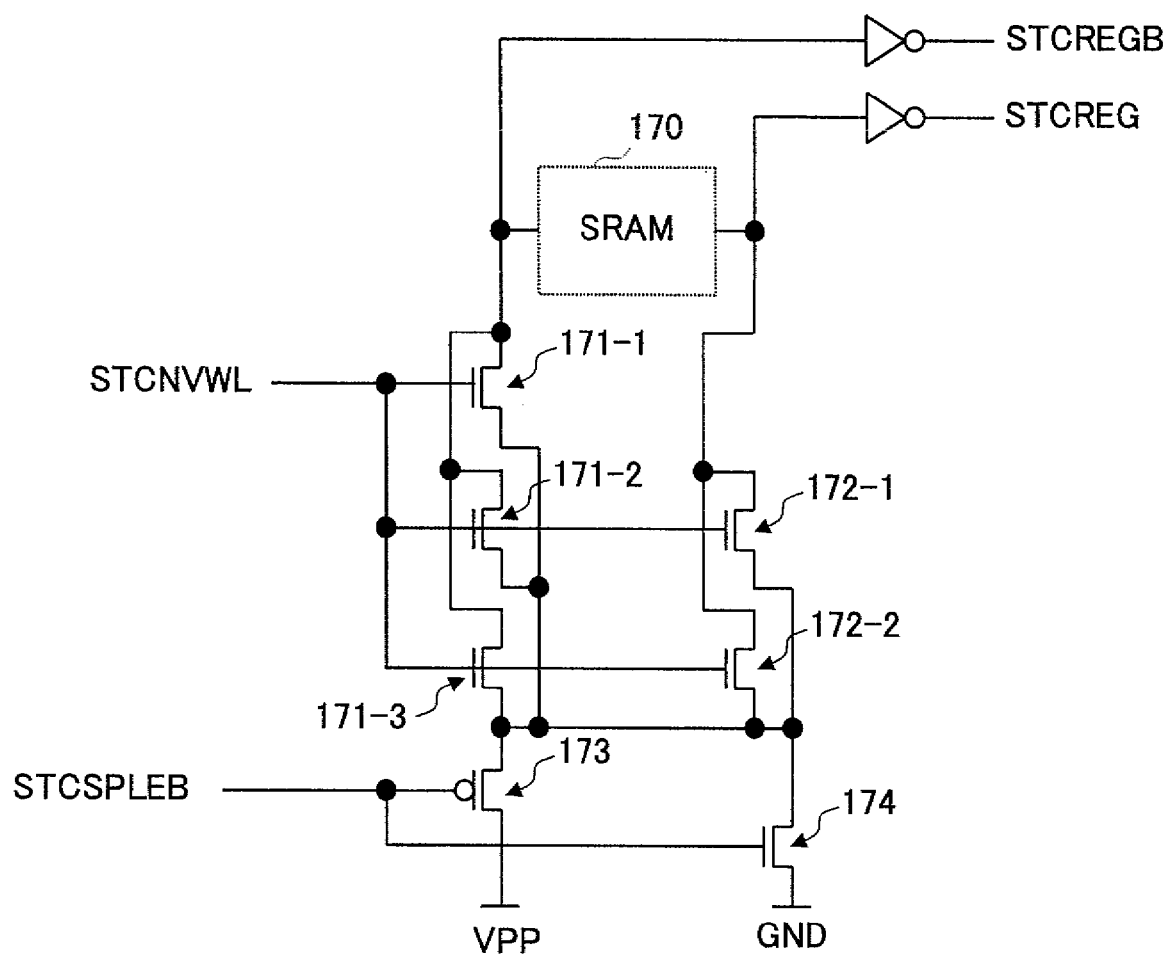
FIG. 19 is a drawing showing a further variation of an STC cell for use in the store time counter.

FIG. 19 is a drawing showing a further variation of an STC cell for use in the store time counter 65. The STC cell shown in FIG. 19 includes an SRAM 170, NMOS transistors 171-1 through 171-3, NMOS transistors 172-1 and 172-2, a PMOS transistor 173, and an NMOS transistor 174.

In the case of the STC cell shown in FIG. 14, three SRAMs 120-1 through 120-3, one of which has one node thereof disconnected from the nonvolatile memory transistor, is used to provide unbalanced pull-down forces. In the case of the STC cell shown in FIG. 19, on the other hand, only one SRAM 170 is provide, and uneven numbers of NMOS transistors are coupled to the two nodes of the SRAM 170, thereby achieving unbalanced pull-down forces.

In FIG. 19, all the NMOS transistors 171-1 through 171-3, 172-1, and 172-2 are designed to have the same transistor characteristics, and thus have substantially the same threshold voltage in the initial state. When the SRAM 170 is activated, the force to pull down one of the two nodes of the SRAM is ⅔ of the force to pull down the other one of the two nodes of the SRAM. As a result, output signals STCREG and STCREGB will always be LOW and HIGH, respectively, in the initial state.

In the examples described above, STC cells are implemented by utilizing MIS transistors as nonvolatile memory cell transistors. Namely, the same mechanism as PermSRAM is used for the store time counter 65. Alternatively, a conventional nonvolatile memory means such as a flash memory may as well be used for the store time counter 65.

Figure 20:
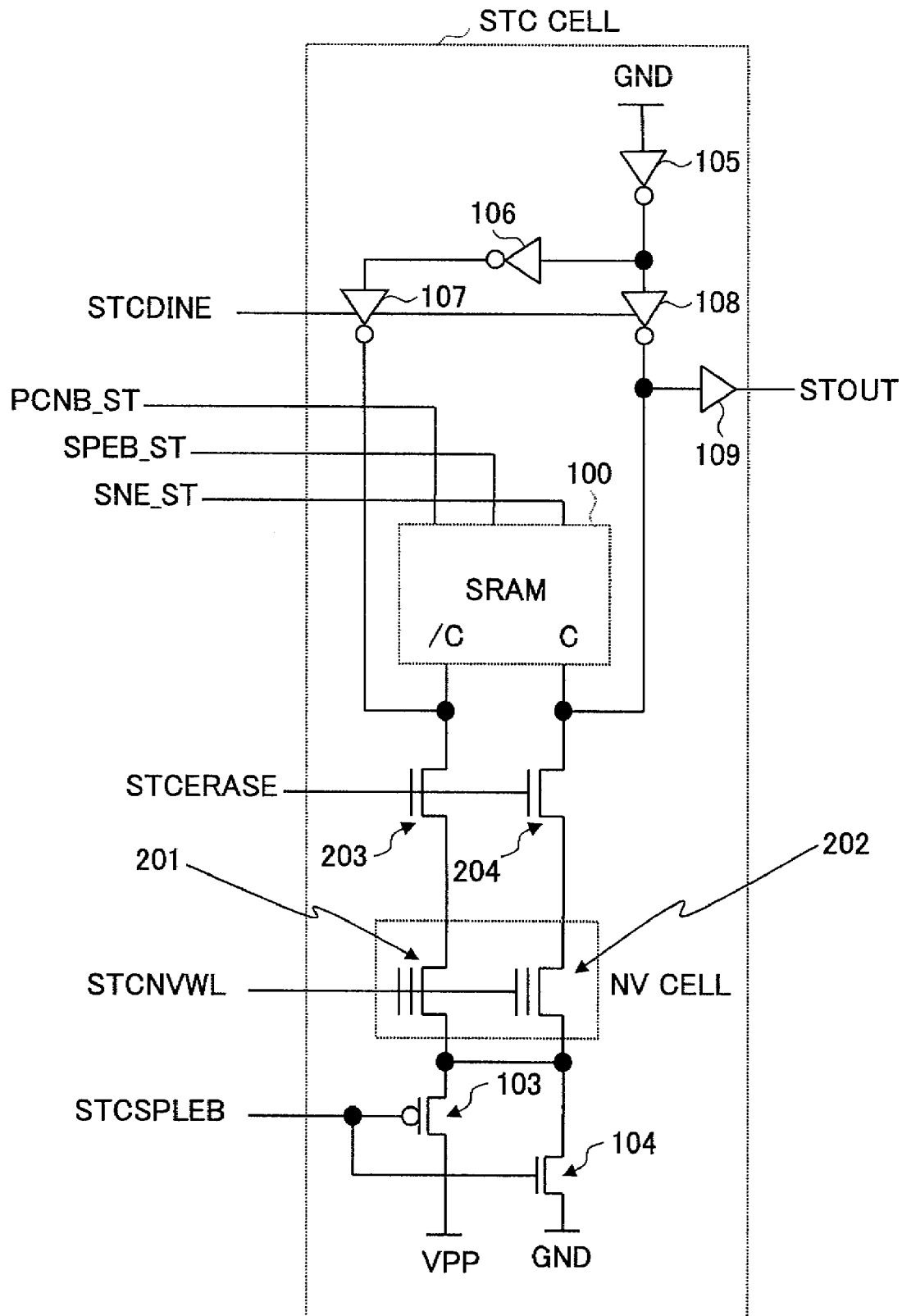
FIG. 20 is a drawing showing an example of the configuration of an STC cell that is implemented by use of a flash memory.

FIG. 20 is a drawing showing an example of the configuration of an STC cell that is implemented by use of a flash memory. In FIG. 20, the same elements as those of FIG. 7 are referred to by the same numerals, and a description thereof will be omitted.

The STC cell shown in FIG. 20 includes an SRAM 100, flash memory transistors 201 and 202, a PMOS transistor 103, an NMOS transistor 104, inverters 105 through 108, a buffer 109, and NMOS transistors 203 and 204. The STC cell of this embodiment uses the flash memory transistors 201 and 202 as a nonvolatile memory means. Each of the flash memory transistors 201 and 202 has a floating gate for trapping electrons to store nonvolatile data. The SRAM 100 is used as a sensing circuit to sense the data stored in the flash memory transistors 201 and 202.

Figure 21:
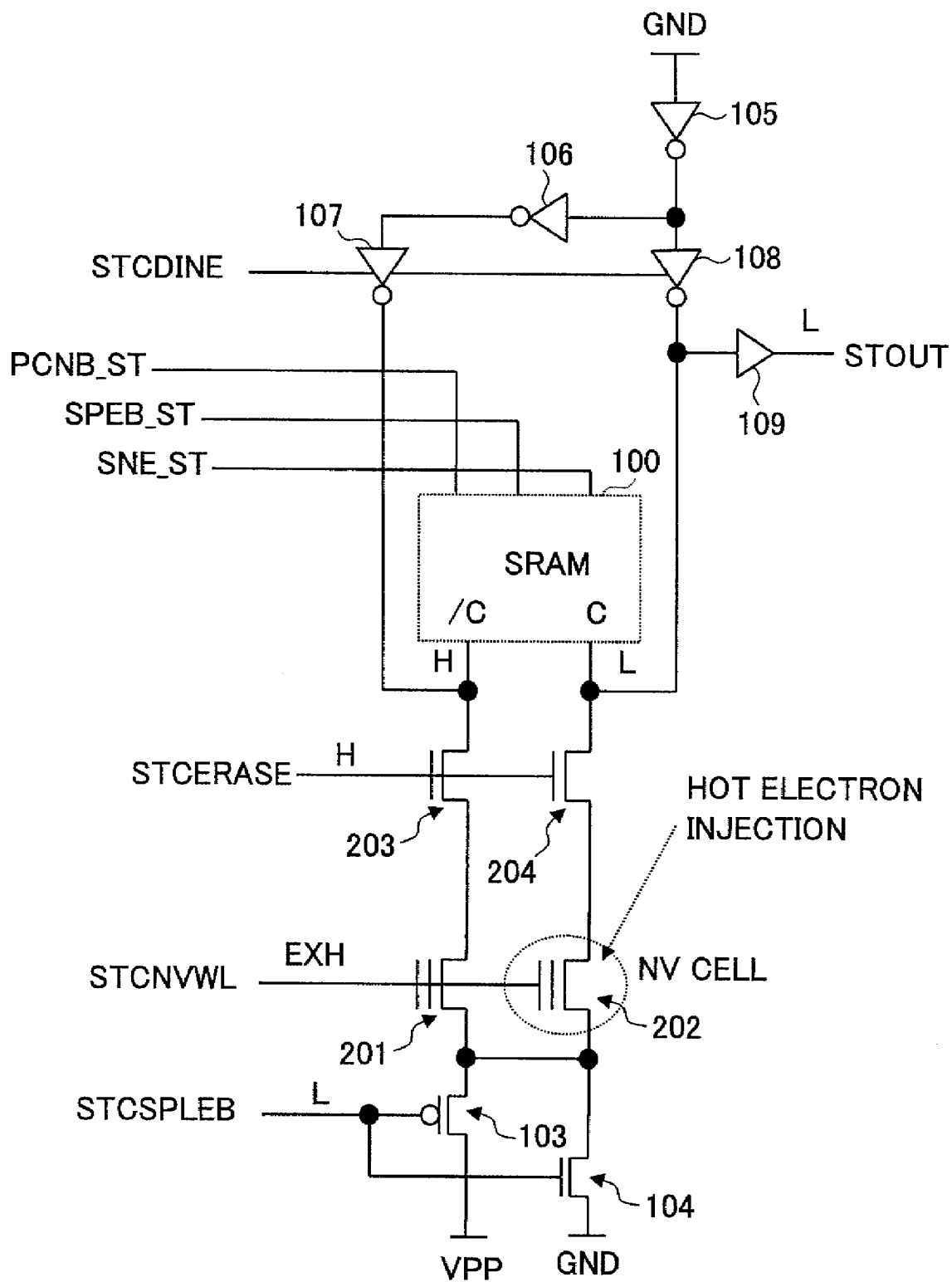
FIG. 21 is a drawing showing the state of the STC cell shown in FIG. 20 at the time of store operation.

FIG. 21 is a drawing showing the state of the STC cell shown in FIG. 20 at the time of store operation. At a store operation, an STC Din enable line STCDINE is set to HIGH so that the nodes C and /C of the SRAM 100 are set to LOW and HIGH, respectively. An erase enable line STCERASE is set to HIGH to make the NMOS transistors 203 and 204 conductive, so that the nodes C and /C are electrically coupled to the flash memory transistors 201 and 202. In this state, an STC NV word line STCNVWL is set to EXH, and an STC store plate voltage enable line STCSPLEB is set to LOW. As a result, hot electron injection occurs with respect to the flash memory transistor 202.

Figure 22:
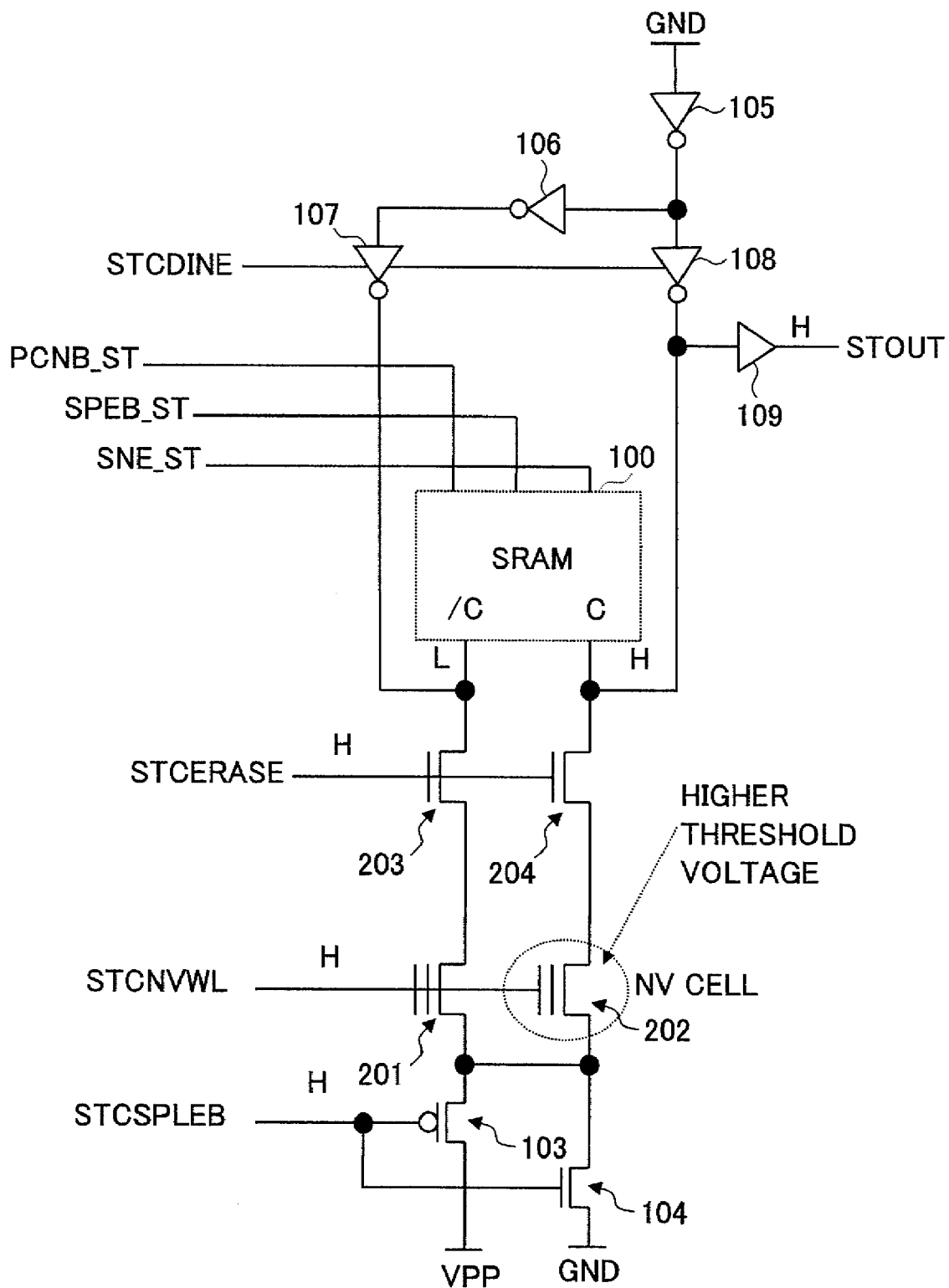
FIG. 22 is a drawing showing the state of the STC cell shown in FIG. 20 at the time of recall operation.

FIG. 22 is a drawing showing the state of the STC cell shown in FIG. 20 at the time of recall operation. At a recall operation, the erase enable line STCERASE is set to HIGH to make the NMOS transistors 203 and 204 conductive, so that the nodes C and /C are electrically coupled to the flash memory transistors 201 and 202. In this state, the STC NV word line STCNVWL is set to HIGH, and the STC store plate voltage enable line STCSPLEB is set to HIGH. In this case, the force to pull down the node C is weaker than the force to pull down the node /C because the flash memory transistor 202 with electrons trapped in its floating gate has a higher threshold voltage than the flash memory transistor 201. As a result, the output STOUT is set to HIGH.

Figure 23:
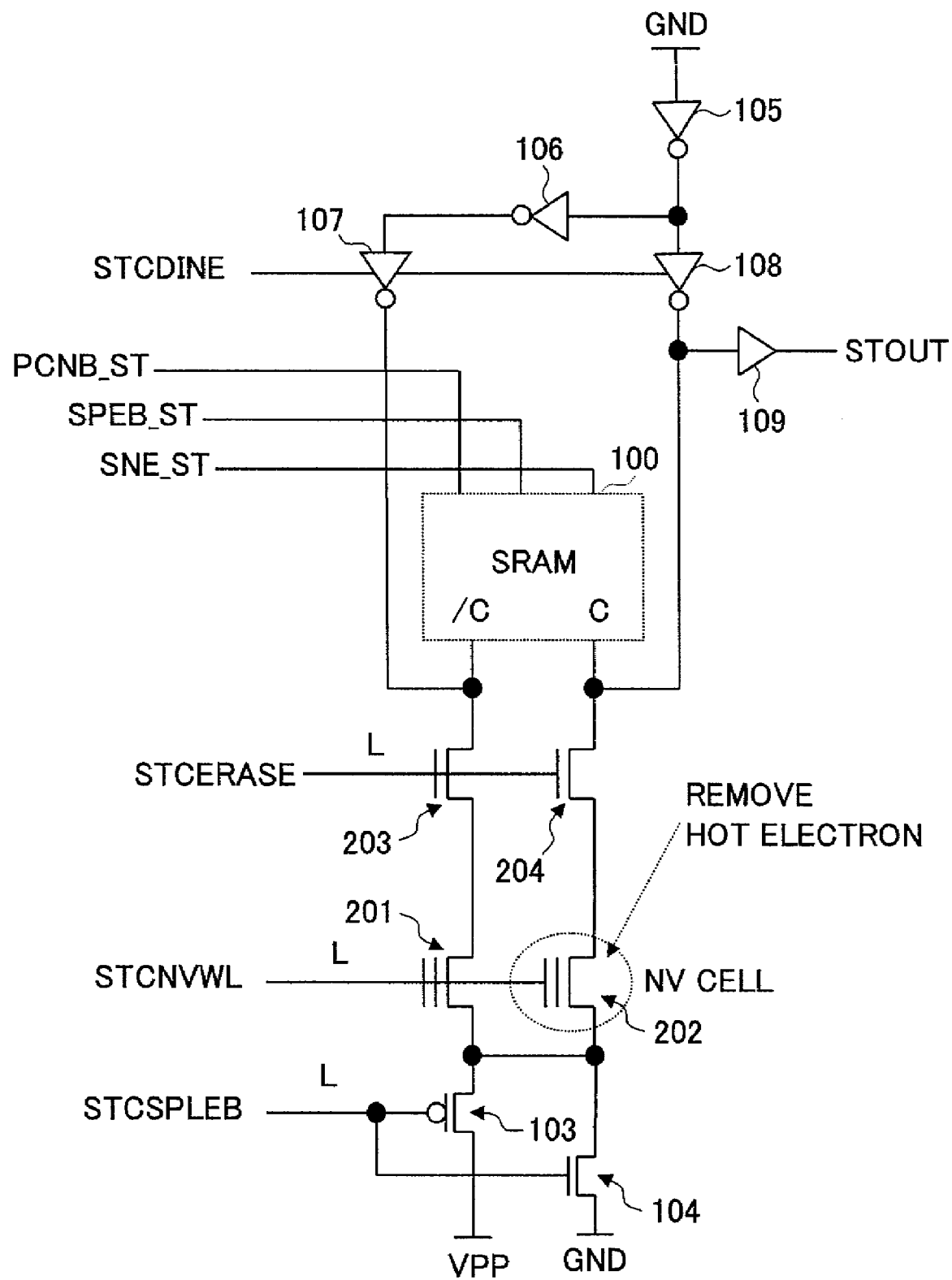
FIG. 23 is a drawing showing the state of the STC cell shown in FIG. 20 at the time of erase operation.

FIG. 23 is a drawing showing the state of the STC cell shown in FIG. 20 at the time of erase operation. At the erase operation, the erase enable line STCERASE is set to L to make the NMOS transistors 203 and 204 nonconductive, so that the flash memory transistors 201 and 202 are electrically disconnected from the nodes C and /C. In this state, the STC store plate voltage enable line STCSPLEB is set to LOW to apply VPP to the flash memory transistors 201 and 202, and the STC NV word line STCNVWL is set to LOW. This removes electrons from the floating gate of the flash memory transistor 202.

Figure 24B:
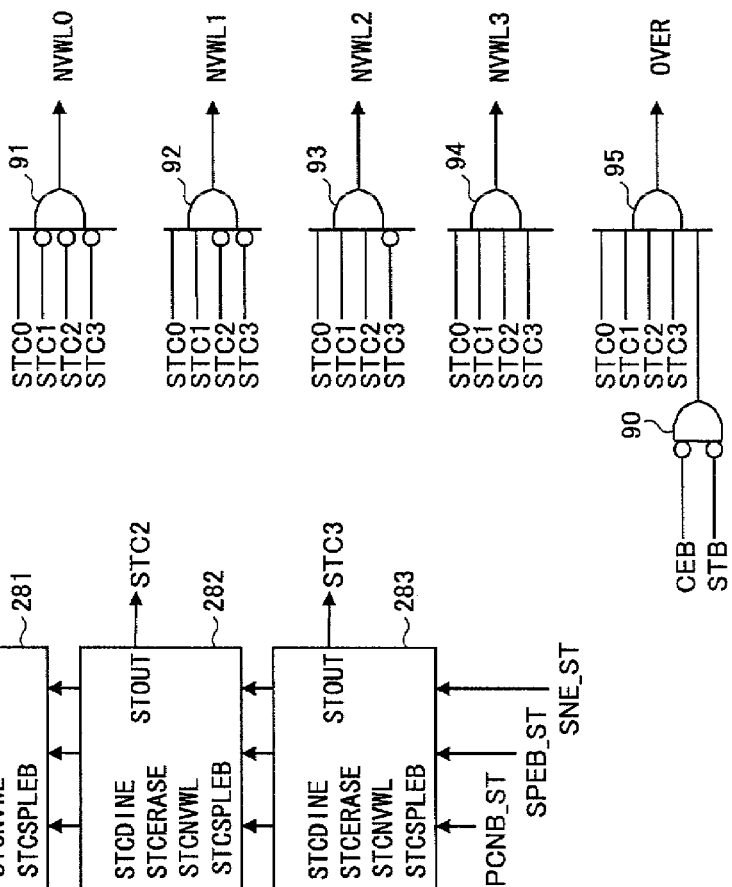
FIGS. 24A and 24B are drawings showing another example of the configuration of the store time counter when the STC cell as shown in FIG. 20 is used.
Figure 24A:
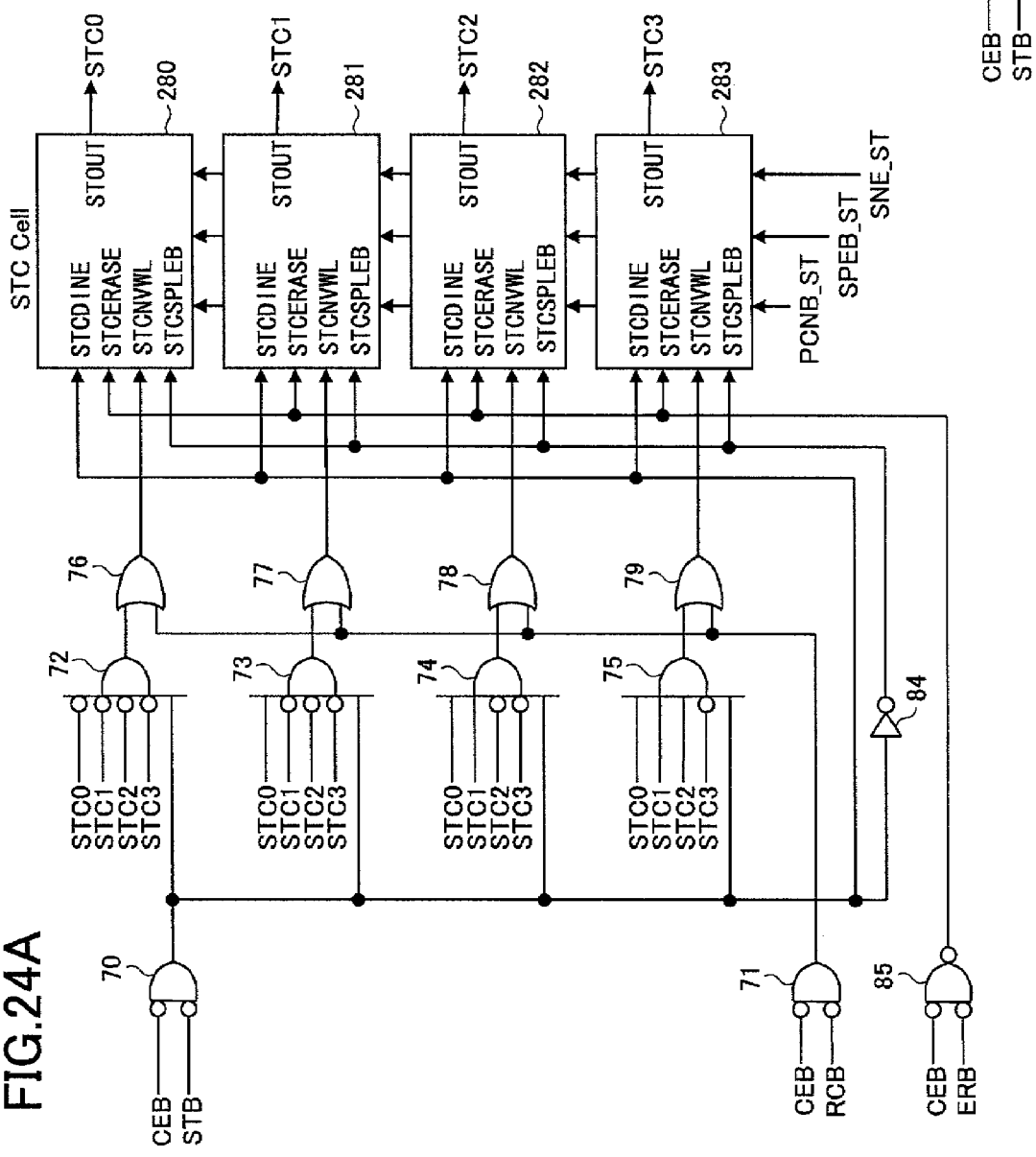

FIGS. 24A and 24B are drawings showing another example of the configuration of the store time counter 65 when the STC cell as shown in FIG. 20 is used. FIG. 24A shows a counter portion of the store time counter 65, and FIG. 24B shows a decoder portion of the store time counter 65. In FIGS. 24A and 24B, the same elements as those of FIGS. 6A and 6B are referred to by the same numerals, and a description thereof will be omitted.

The counter portion of the store time counter 65 shown in FIG. 24A includes AND gates 70 through 75, OR gates 76 through 79, STC cells 280 through 283, an inverter 84, and an NAND gate 85. Each of the STC cells 280 through 283 has the same configuration as that shown in FIG. 20. The NAND gate 85 has the two inputs thereof inverted as indicated by open circles attached to these input nodes, and serves to generate the erase enable signal STCERASE based on the chip enable signal CEB and an erase enable signal ERB. The decoder portion of the store time counter 65 shown in FIG. 6B includes AND gates 90 through 95. The AND gates 91 through 95 serve to decode the STC-cell output signals STC0 through STC3 supplied from the STC cells 280 through 283 shown in FIG. 24A, thereby activating one of the NV word lines NVWL0 through NVWL3 and an overflow signal OVER.

FIG. 25 is a timing chart showing the signal levels of relevant signals with respect to a plurality of store/recall operations.

At the erase operation shown in FIG. 25, the chip enable signal CEB and the erase enable signal ECB (which is supplied from outside the semiconductor memory device 20) are activated to perform an erase operation, which results in all the STC-cell output signals STC0 through STC3 being set to "0".

At the first store operation shown in FIG. 25, the chip enable signal CEB and the store enable signal STB are activated to perform a store operation. Since the STC-cell output signals STC0 through STC3 are all "0", only the NOR gate 76 produces a HIGH output, while the other NOR gates 77 through 79 produce a LOW output (see FIG. 24A). As a result, a store operation is performed only with respect to the STC cell 280.

At the first recall operation shown in FIG. 25, the chip enable signal CEB and the recall enable signal RCB are activated to perform a recall operation, which results in the STC-cell output signal STC0 being set to "1" and all the other STC-cell output signals STC1 through STC3 being set to "0".

The second and subsequent store/recall operations are performed in the same manner as the first store/recall operation as described above. At the end, the fifth store operation is attempted, resulting in the overflow signal OVER being set to "1" as shown in FIG. 25.

In the manner as described above, the store time counter 65 counts up each time a store operation is performed, thereby shifting the position of the currently activated NV word line one by one. That is, one of the NV word lines NVWL0 through NVWL3 is successively activated, and the change of activation occurs each time a store operation is performed. The use of the store time counter 65 thus makes it possible to identify which one of the four nonvolatile transistor pairs of the NV cell unit 51 (see FIG. 2) is currently in use.

Further, the present invention is not limited to these embodiments, but various variations and modifications may be made without departing from the scope of the present invention.

What is claimed is:

1. A nonvolatile semiconductor memory device, comprising:
 a latch configured to store data;
 a plurality of word lines;
 a driver configured to activate one of the plurality of word lines; and
 a plurality of nonvolatile memory cells coupled to the respective word lines, each of the nonvolatile memory cells coupled to the latch so as to exchange stored data with the latch upon activation of a corresponding one of the word lines, each of the nonvolatile memory cells including two MIS transistors and configured to store data as an irreversible change of transistor characteristics occurring in one of the two MIS transistors,
 wherein the driver includes at least one nonvolatile memory cell storing count data responsive to a number of times storing of data has been performed with respect to the plurality of nonvolatile memory cells, and is configured to activate one of the word lines indicated by the count data.

2. The nonvolatile semiconductor memory device as claimed in claim 1, wherein the driver is configured such that the count data is changed to indicate a next one of the word lines each time the storing of data is performed with respect to the plurality of nonvolatile memory cells.

3. The nonvolatile semiconductor memory device as claimed in claim 1, wherein said at least one nonvolatile memory cell includes a pair of MIS transistors, and is configured to store the count data as an irreversible change of transistor characteristics occurring in one of the pair of MIS transistors.

4. The nonvolatile semiconductor memory device as claimed in claim 3, wherein a first MIS transistor of the pair of MIS transistors has a ratio of gate width to gate length different from that of a second MIS transistor of the pair of MIS transistors, and wherein the driver further includes a sense circuit configured to sense a difference in electrical property between the first MIS transistor and the second MIS transistor.

5. The nonvolatile semiconductor memory device as claimed in claim 1, wherein said at least one nonvolatile memory cell includes three or more MIS transistors, and is configured to store the count data as an irreversible change of transistor characteristics occurring in at least one of the three or more MIS transistors, and wherein the driver further includes a sense circuit having two nodes coupled to uneven numbers of the three or more MIS transistors, respectively, and is configured to sense a difference in electrical property appearing between the two nodes.

6. The nonvolatile semiconductor memory device as claimed in claim 1, wherein said at least one nonvolatile memory cell includes a pair of flash memory transistors.

7. The nonvolatile semiconductor memory device as claimed in claim 1, comprising a plurality of memory cell units, each of which has an identical circuit configuration including the latch and the plurality of nonvolatile memory cells.

8. The nonvolatile semiconductor memory device as claimed in claim 1, wherein a latch includes a first node and a second node configured to be set to potentials responsive to latched data and inverse to each other, and wherein each of the nonvolatile memory cells include:

a first MIS transistor having one of source/drain nodes thereof coupled to the first node of the latch, and a gate node thereof coupled to a corresponding one of the word lines; and a second MIS transistor having one of source/drain nodes thereof coupled to the second node of the latch, and a gate node thereof coupled to the corresponding one of the word lines.

* * * * *